(12) United States Patent
Kozaczuk et al.

(10) Patent No.: US 10,411,711 B2
(45) Date of Patent: Sep. 10, 2019

(54) FPGA HAVING A VIRTUAL ARRAY OF LOGIC TILES, AND METHOD OF CONFIGURING AND OPERATING SAME

(71) Applicant: Flex Logix Technologies, Inc., Mountain View, CA (US)

(72) Inventors: Anthony Kozaczuk, Burlingame, CA (US); Cheng C. Wang, San Jose, CA (US); Abhijit M. Abhyankar, Sunnyvale, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 15/975,037

(22) Filed: May 9, 2018

(65) Prior Publication Data
US 2018/0343010 A1    Nov. 29, 2018

Related U.S. Application Data

(60) Provisional application No. 62/511,739, filed on May 26, 2017.

(51) Int. Cl.
*H03K 19/177*        (2006.01)
*G06F 17/50*         (2006.01)

(52) U.S. Cl.
CPC ..... *H03K 19/1776* (2013.01); *G06F 17/5054* (2013.01); *G06F 17/5068* (2013.01); *H03K 19/17704* (2013.01); *H03K 19/17728* (2013.01); *H03K 19/17736* (2013.01)

(58) Field of Classification Search
CPC ........ H03K 19/1776; H03K 19/17704; H03K 19/17728; H03K 19/17736; G06F 17/5068

USPC ......................................................... 326/41
See application file for complete search history.

(56) References Cited

U.S. PATENT DOCUMENTS

| | | | |
|---|---|---|---|
| 5,682,107 A * | 10/1997 | Tavana | H03K 19/17704 326/39 |
| 5,933,023 A | 8/1999 | Young | |
| 6,094,066 A | 7/2000 | Mavis | |
| 6,211,695 B1 * | 4/2001 | Agrawal | H03K 19/17728 326/38 |
| 6,671,865 B1 | 12/2003 | Ali et al. | |
| 7,518,402 B2 | 4/2009 | Schmit et al. | |

(Continued)

OTHER PUBLICATIONS

International Search Report and Written Opinion of International Searching Authority, dated Jul. 27, 2018, 10 pages.

*Primary Examiner* — Daniel D Chang
(74) *Attorney, Agent, or Firm* — Neil A. Steinberg

(57) ABSTRACT

An integrated circuit comprising a physical array of logic tiles, wherein each logic tile includes a perimeter and a plurality of external I/O disposed in a layout on the perimeter of the logic tile wherein the layout of the external I/O of each logic tile is identical. The physical array includes a first virtual array of logic tiles, programmed to perform data processing operations, including a first plurality of logic tiles of the physical array. The physical array also includes a second virtual array of logic tiles, programmed to perform second operations, including a second plurality of logic tiles of the physical array. The logic tiles of the second plurality are different from the logic tiles of the first plurality. In one embodiment, performance of the data processing operations of the first virtual array is independent from performance of the second operations of the second virtual array.

20 Claims, 26 Drawing Sheets

(56) References Cited

U.S. PATENT DOCUMENTS

| | | | |
|---|---|---|---|
| 8,493,090 B1 | 7/2013 | Trimberger | |
| 2004/0010767 A1 | 1/2004 | Agrawal et al. | |
| 2004/0113655 A1 | 6/2004 | Curd et al. | |
| 2005/0050522 A1 | 3/2005 | Kami et al. | |
| 2007/0200594 A1 | 8/2007 | Levi et al. | |
| 2008/0218202 A1 | 9/2008 | Arriens et al. | |
| 2008/0258761 A1* | 10/2008 | Hutchings | G06F 7/764 326/38 |
| 2009/0002022 A1* | 1/2009 | Hutchings | H03K 19/17736 326/38 |
| 2011/0012640 A1 | 1/2011 | Vorbach et al. | |
| 2011/0121366 A1 | 5/2011 | Or-Bach et al. | |
| 2012/0012895 A1 | 1/2012 | Or-Bach et al. | |
| 2012/0286822 A1 | 11/2012 | Madurawe | |
| 2015/0100756 A9 | 4/2015 | Vorbach et al. | |
| 2016/0246712 A1 | 8/2016 | Vucinic et al. | |
| 2016/0321081 A1 | 11/2016 | Kim et al. | |
| 2016/0342722 A1 | 11/2016 | Sentieys et al. | |
| 2017/0063378 A1* | 3/2017 | Tate | H03K 19/1776 |

* cited by examiner

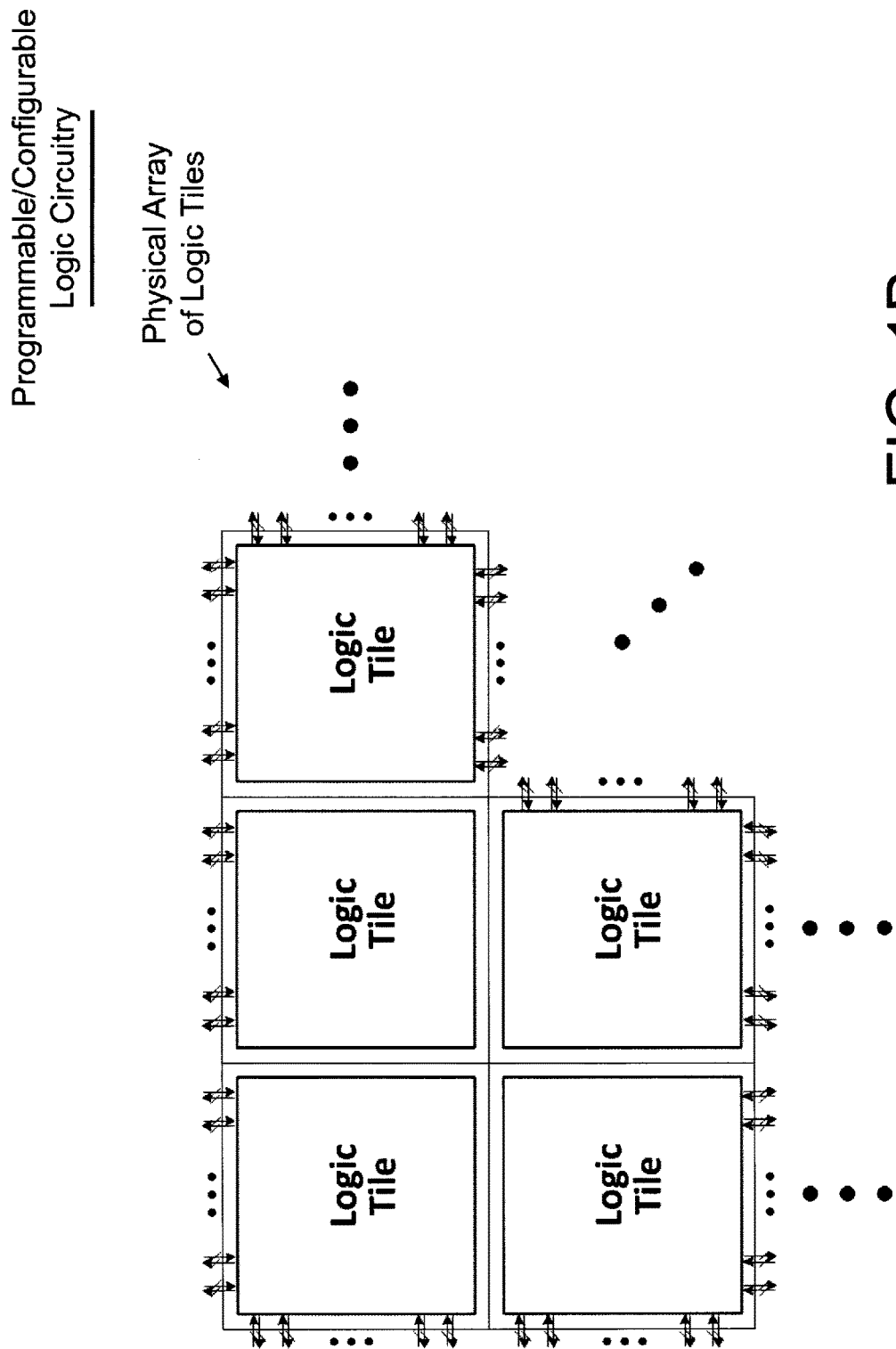

EXEMPLARY EMBODIMENT:
- Configuration Embodiment: Compiler combines $f(1)$, $f(2)$ bitstreams and generates a combined bitstream of $f(1) + f(2)$ to program the physical array of logic tiles of the FPGA EXEMPLARY EMBODIMENT:
- Configuration Embodiment: Compiler combines $f(1), \ldots, f(y)$ bitstreams and generates a combined bitstream of $f(1) + \ldots + f(y)$ to program the physical array of logic tiles of the FPGA EXEMPLARY EMBODIMENT:
- Configuration Embodiment: Compiler combines f(1) bitstream with bitstream of other tiles and generates a combined bitstream to program the entire physical array of logic tiles EXEMPLARY EMBODIMENT:
- Configuration Embodiment: Compiler combines f(1) bitstream, f(2) bitstream and bitstream of other logic tiles to generate a combined bitstream to program the physical array of logic tiles

FPGA HAVING A VIRTUAL ARRAY OF LOGIC TILES, AND METHOD OF CONFIGURING AND OPERATING SAME

RELATED APPLICATION

This non-provisional application claims priority to and the benefit of U.S. Provisional Application No. 62/511,739, entitled "FPGA having a Virtual Array of Logic Tiles, and Method of Configuring and Operating Same", filed May 26, 2017. The '739 provisional application is incorporated herein by reference in its entirety.

STATEMENT OF U.S. GOVERNMENT RIGHTS

This invention was made with Government support under Agreement No. HR0011-17-9-0002, awarded by DARPA. The Government has certain rights in the invention.

INTRODUCTION

In one aspect, the present inventions are directed to an integrated circuit including a field programmable gate array (FPGA) disposed therein/thereon (hereinafter collectively "therein") wherein the FPGA includes programmable/configurable logic circuitry which includes a physical array of tiles, each tile including programmable components ("tiles" are often called "configurable logic blocks" (CLB), "logic array blocks" (LAB), or "logic tiles"—hereinafter collectively "logic tiles") wherein the physical array of logic tiles is functionally and/or operationally "partitioned" to provide or form one or more virtual arrays of logic tiles which is/are programmed, configured or defined to implement one or more functions or operations. The virtual arrays of logic tiles may be, for example, a physically contiguous or non-contiguous subset of logic tiles of the physical array of logic tiles. The virtual arrays of logic tiles may be programmed, configured or defined to perform or implement one or more specific functions/operations.

In one embodiment, a first portion of the plurality of logic tiles (a first virtual array) is programmed, configured or defined to implement a first function/operation and a second portion of the logic tiles (a second virtual array) is programmed, configured or defined to implement a second function/operation. For example, the virtual array of logic tiles implementing the first function/operation may be programmed or configured as a data processor or a microcontroller and the virtual array of logic tiles implementing the second function/operation may be configured as logic (e.g., to interface with the processor or controller), an accelerator, a digital signal processor (DSP), a data encryption engine, a filter, an encoder, a state machine and/or memory with an interconnect network. Notably, where the physical array of logic tiles is functionally and/or operationally "partitioned" to form a plurality of virtual arrays, the number of logic tiles in each of the virtual arrays of the physical array may be the same as or different from other virtual arrays of the physical array of logic tiles of the FPGA.

The one or more (or all) of the virtual arrays of logic tiles may be programmed, configured or defined to operate independently from and/or dependently on one or more (or all) of the other virtual arrays. Such one or more (or all) of the virtual arrays of logic tiles may operate fully or partially independently during all or a portion of the operation of the FPGA. In one embodiment, the physical array of logic tiles may be partitioned and programmed, configured or defined such that (i) one or more of the virtual arrays of logic tiles may be configured to operate independently from one or more (or all) of the other virtual arrays and (ii) one or more of the same or different virtual arrays of logic tiles may be configured to operate dependently on one or more (or all) of the other virtual arrays. Notably, all combinations and permutations of independent and dependent operation for each of the virtual arrays of logic tiles (or relative to the other logic tiles of the physical array) are intended to fall within the scope of the inventions.

The one or more (or all) of the virtual arrays of logic tiles may include, receive, generate and/or employ one or more different clock signals (or different clock domains). In addition thereto, or in lieu thereof, two or more (or all) of the virtual arrays may include, generate and/or employ one or more common clock signals (or common clock domains) to, for example, facilitate synchronous and/or synchronize operation (e.g., between circuitry of such virtual arrays or between circuitry of such virtual arrays and external circuitry or the user). Indeed, two or more (or all) of the virtual arrays may employ a common clock signal (or common clock domain) and one or more (or all) virtual arrays of logic tiles may include, receive, generate and/or employ different clock signal(s) (or different clock domain(s)). All combinations and permutations of one or more different clock signals (or different clock domains) and one or more common clock signals (or common clock domains) in relation to the use and generation, on a virtual array-by-virtual array basis, are intended to fall within the scope of the inventions.

In one embodiment, one or more (or all) of the virtual arrays of logic tiles include and/or employ physically different or separate external I/Os (e.g., independent external I/Os to interface/communicate with circuitry external to the physical array of logic tiles). In another embodiment, one or more (or all) of the virtual arrays of logic tiles include and/or employ physically common I/Os (e.g., using a time division multiplex technique). Indeed, one or more (or all) of the virtual arrays of logic tiles may include and/or employ physically different or separate I/Os as well as physically common I/Os. All combinations and permutations of physically separate I/Os and physically common I/Os, on a virtual array-by-virtual array basis, are intended to fall within the scope of the present inventions.

Moreover, in one embodiment, the virtual array may include virtual I/Os to connect to or facilitate communication with other portions of the physical array of logic tiles (which may be another virtual array). For example, the virtual I/Os may be located or disposed on the perimeter of a logic tile of a virtual array which is interior of the physical array of logic tiles. Such virtual I/Os may transmit command, address and data signals between the logic tiles of the virtual array and other portions of the physical array (such as, for example, between the logic tiles of the physical array and logic tiles of a virtual array that is configured as or to perform operations of a data processor, microcontroller, an accelerator, a data encryption engine, a filter, a DSP, an encoder, and/or a state machine). In one embodiment, the virtual I/Os provide a communication path to output data after performance of the function or operation performed by the virtual array of logic tiles and/or to input data (i) to use in the function or operation and/or (ii) upon which the function or operation is to be performed (e.g., encryption).

The virtual arrays of logic tiles of the physical array may directly communicate with one or more of the other virtual arrays of logic tiles. For example, in one embodiment, one or more virtual arrays of logic tiles may communicate with one or more other virtual arrays of logic tiles using an interconnect network or fabric. Such interconnect network or fabric may be configured, for example, at power-up, start-up, during initialization or re-initialization, and/or at reset or like sequence/operation (which may be before, during/concurrently or after configuration of the virtual array of logic tiles). Indeed, in one embodiment, the logic tiles of the virtual arrays may synchronously communicate with or synchronize communication between logic tiles of one or more other virtual arrays based on or using a first clock signal or first clock domain and communicate externally of the physical array based on or using a second clock signal or second clock domain. Notably, all combinations of communication between and among the logic tiles of the virtual arrays are intended to fall within the scope of the present invention. In addition, all combinations of communication between one or more virtual arrays and circuitry external to the physical array of logic tiles are intended to fall within the scope of the present invention Indeed, all forms and/or methods (physical or functional) of communication are intended to fall within the scope of the present inventions. Moreover, the present inventions may employ any switch interconnect network or fabric that facilitates communication between the logic tiles of one or more other virtual arrays of logic tiles. (See, e.g., U.S. Pat. No. 9,503,092, which is incorporated herein by reference).

In one embodiment, one or more (or all) of the virtual arrays of logic tiles "share" circuitry, memory (e.g., DRAM, SRAM etc.), clock generation or alignment circuitry (e.g., a PLL, DLL, oscillator) and/or other "resources" which are external to the entire physical array of physically contiguous logic tiles. For example, in one embodiment, a plurality of the virtual arrays of logic tiles may couple to the same clock generation circuitry (e.g., a plurality of virtual arrays may receive one or more outputs of the same oscillator circuitry) and/or may access the same physical embedded or discrete memory. Indeed, in one embodiment, such memory may be segmented or partitioned such that certain subarrays, blocks or pages are associated with or allocated or dedicated to a particular virtual array or to two or more of the virtual arrays. The memory may be any kind, type, size and/or configuration (e.g., dual port). Notably, in one embodiment, the FPGA of the invention employs the architectures described and/or illustrated in U.S. patent application Ser. No. 15/239,958 (which is hereby incorporated by reference in its entirety), for example, wherein memory is disposed or located between (i) logic tiles of a virtual array, (ii) a logic tile of a first virtual array and a logic tile of a second virtual array, and/or (iii) logic tiles of the physical array (which may or may not be logic tiles of one or more virtual arrays) wherein such logic tiles may control, write to data and read data from the memory (e.g., dual port SRAM memory) disposed between the logic tiles.

The physical array of logic tiles, including the one or more of the virtual arrays of logic tiles, may be configured using any technique now known or later developed. In one embodiment, the physical array of logic tiles are configured via one or more compilers (hereinafter collectively "compiler") which, in one embodiment, separately generate and receive a plurality of bitstreams (which is designed to implement at least one particular function/operation), wherein each bitstream is representative of or corresponds to configuration or program data of the associated virtual array of logic tiles. Using the plurality of bitstreams, the compiler may generate a compiled or "merged" bitstream which is representative of or corresponds to the configuration data of a certain portion of the physical array of logic tiles (e.g., all or substantially all of the physical array of logic tiles)—including each of the virtual arrays of logic tiles corresponding to or associated with the "merged" or combined bitstream (i.e., one bitstream which is a composite bitstream of each bitstream of each of the virtual arrays of logic tiles). When the compiled or composite bitstream is executed, the physical array of logic tiles is programmed or configured. In this way, each of the virtual arrays of physical logic tiles is configured via implementation or execution of a single composite bitstream (versus separately programming or configuring the circuitry in each of the virtual arrays via multiple separate or distinct bitstreams associated with the virtual arrays).

For example, in this embodiment, the compiler generates the bitstream associated with the first virtual array and the bitstream associated with the second virtual array (and a bitstream associated with any of the other logic tiles) and thereafter combines the bit streams associated with the first virtual array of logic tiles (which is designed to implement the first function/operation) and the second virtual array of logic tiles (which is designed to implement the second function/operation) to generate a composite bitstream which is employed to configure the entire physical array of logic tiles of the FPGA—including each of the virtual arrays of the physical logic tiles or stated differently, physical logic tiles associated with or corresponding to virtual arrays. Thus, in this embodiment, the bitstream of a virtual array may be separately generated, and thereafter "merged" or combined with the other bitstreams corresponding to the physical array of logic tiles (including bitstreams associated with other virtual array(s)) to generate a composite bitstream. The composite bitstream may then be executed or implemented to configure or program the physical array of logic tiles (including the virtual array(s) of logic tiles) of the FPGA in order to render the programmable/configurable logic circuitry of the FPGA operational.

The configuration data may be stored in memory located/resident on the integrated circuit. In one embodiment, at power-up or start-up and/or during initialization, re-initialization, configuration, and/or re-configuration of the physical array of logic tiles and/or the integrated circuit, the configuration data is read out of the memory and applied to the physical array of logic tiles and the logic tiles are responsively configured. As noted above, the bitstream(s) of configuration data for the logic tiles corresponding to the virtual array(s) may be applied to the logic tiles separately or in a composite form.

In one embodiment, one or more virtual arrays of the logic tiles (implementing a first function/operation) may be locked, fixed and/or encrypted (collectively hereinafter, "encrypted") such that the configuration of such virtual array(s) may not be configured/re-configured, defined, modified and/or altered, for example, by a user or designer. In addition, one or more other virtual arrays (implementing a function/operation different from the first function/operation) may be unlocked, definable or modifiable such that the configuration of such virtual array(s) may be configured/re-configured, determined and/or defined, for example, by a user or designer. In one embodiment, a compiler separately generates the bitstreams associated with the configuration of physical array (which includes each of the virtual arrays of logic tiles) and thereafter generates a composite bitstream by combining the bitstreams associated with the first and second virtual arrays together with other bitstreams (if any) that may define or configure other aspects of the physical array (e.g., logic tiles not part of the first or second virtual arrays). The composite configuration data may be stored in the memory located/resident on the integrated circuit.

In one embodiment, at power-up or start-up and/or during initialization, re-initialization, configuration, and/or re-configuration of the physical array of logic tiles and/or the integrated circuit, the composite configuration data is read out of the memory. The physical array of logic tiles of the FPGA (which includes configuration or programming of the "locked" and "unlocked" virtual arrays) may then be configured using the composite or one combined bitstream. For example, in one embodiment, the compiler may combine or compile the bitstreams associated with the first virtual array of logic tiles (which is designed to implement a first function/operation that is not user definable) and the second virtual array of logic tiles (which is designed to implement a second function/operation that is user definable) into a combined or composite file or bitstream that defines the physical array of the FPGA in order to program or configure the virtual arrays of physical array of logic tiles of the FPGA.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

BRIEF DESCRIPTION OF THE DRAWINGS

The present inventions may be implemented in connection with embodiments illustrated in the attached drawings. These drawings show different aspects of the present inventions and, where appropriate, reference numerals and reference names illustrating like structures, circuits, circuitry, components, materials and/or elements in different figures are labeled similarly. It is understood that various combinations of the structures, components, materials and/or elements, other than those specifically shown, are contemplated and are within the scope of the present inventions. Notably, embodiments or implementations described herein as "exemplary" are not to be construed as ideal, preferred or advantageous, for example, over other embodiments or implementations; rather, it is intended reflect or indicate the embodiment(s) is/are "example" embodiment(s).

FIG. 1B illustrates a block diagram representation of a physical array of a plurality of logic tiles plurality of an exemplary embodiment of programmable, for example, of an exemplary FPGA, wherein input/output of the logic tiles may facilitate communication between logic tiles and/or circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (e.g., a hierarchical network and/or mesh network; an exemplary interconnect network is set forth in U.S. Pat. No. 9,503,092, which is incorporated herein by reference);

Figure 1A:
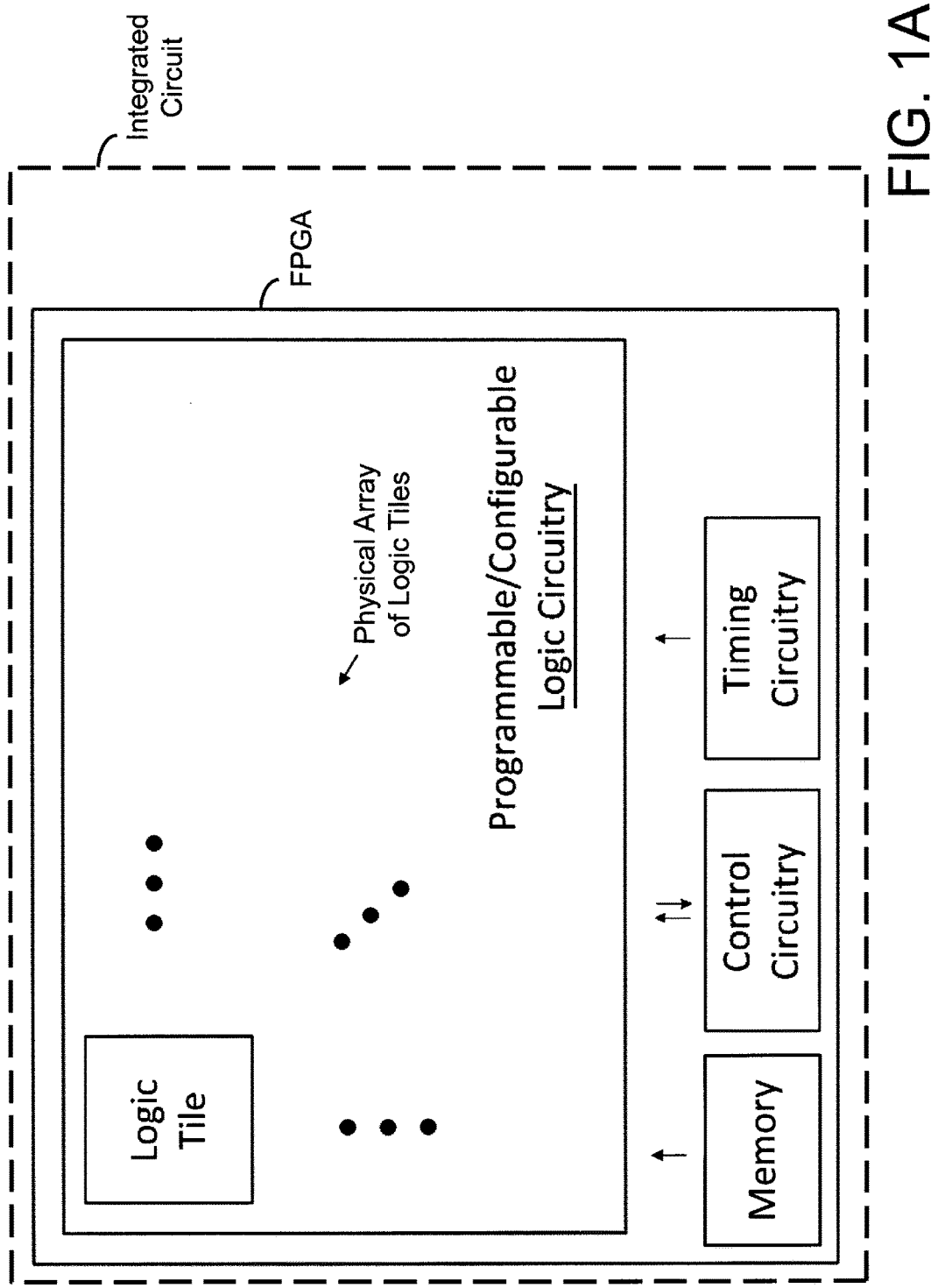
FIG. 1A illustrates a block diagram representation of, for example, an exemplary integrated circuit including control circuitry, timing or clock circuitry and programmable/configurable logic circuitry (which includes a plurality of logic tiles, each of which typically includes thousands of transistors (certain transistors may be interconnected, for example, as multiplexers having two or more inputs which are electrically interconnected into a network as well as connected to, for example, associated data storage elements, input pins and/or lookup tables that, when programmed, determine the operation of the multiplexers))
Figure 1C:
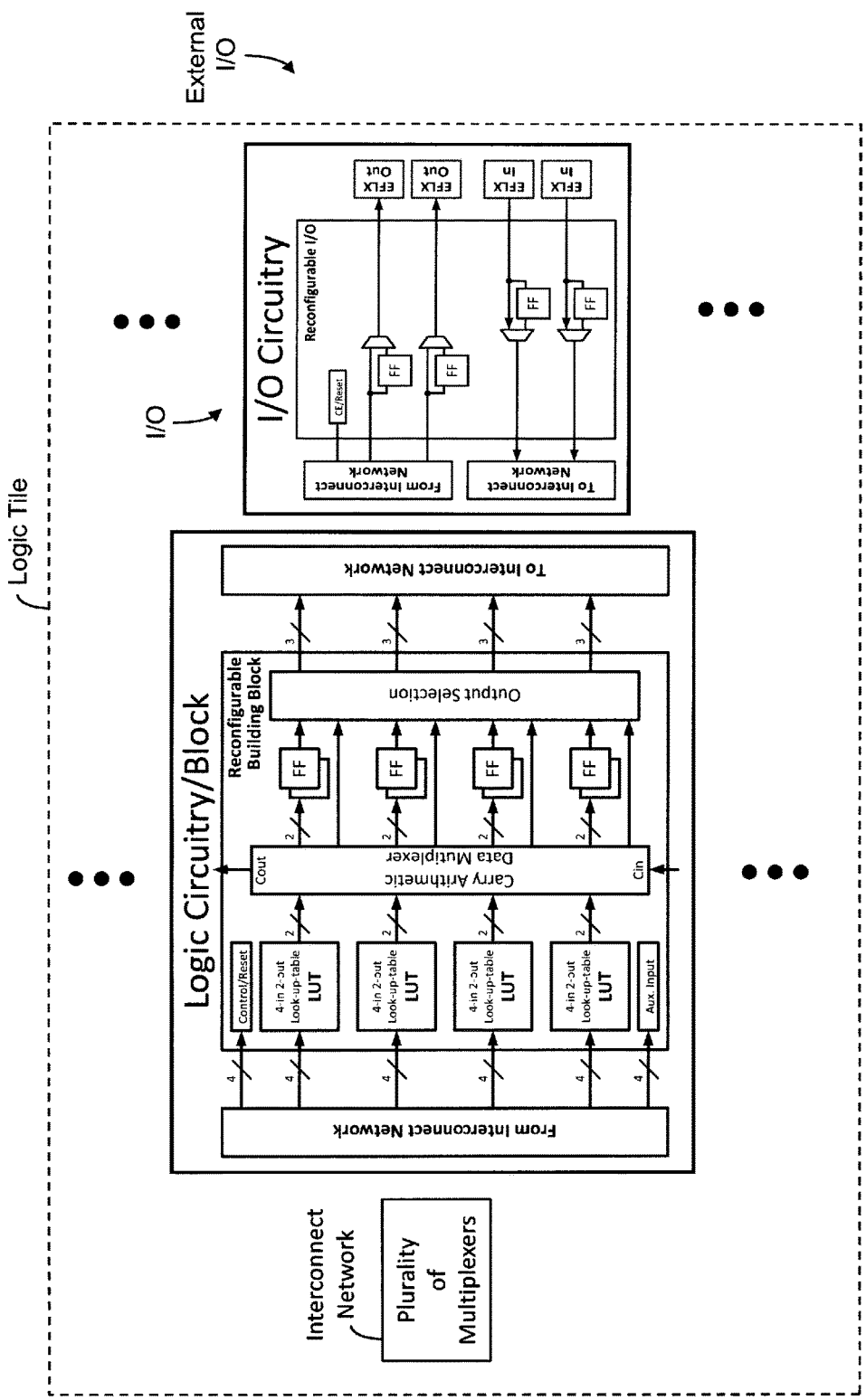
FIG. 1C illustrates a block diagram representation of a portion of an exemplary logic tile of the programmable/configurable logic circuitry of FIG. 1A, wherein the logic tile includes logic and I/O for example, a plurality of (i) logic blocks, each logic block including, for example, a plurality of look-up-tables, arithmetic blocks, data multiplexers, flip-flops, and control/reset circuitries, (ii) I/O (I/O circuitry or blocks, which are disposed on the periphery, perimeter or edge of the logic tile, to facilitate interconnection between circuitry of the logic tile and circuitry external to the tile (and, in one embodiment, external to the logic tile array of the programmable/configurable logic) and (iii) an interconnect network composed of one or more multiplexers or switches which may be arranged or configured into an interconnect network having a plurality of switch matrix or switch matrices stages, to, for example, perform or facilitate performance of logic operation in or during normal operation of the currently configured integrated circuit; notably, the I/O (e.g., the physical points of entry/exit of the signals to the logic tile—all forms thereof are intended to fall within the scope of the present invention) are typically disposed along the entire perimeter, periphery or border of the logic tile (e.g., where the logic tile has a square or rectangle shape, on all four sides—see FIGS. 1B and 1D); notably, I/O means one input/output (which may be uni-directional conductor and/or bi-directional conductor) and/or a plurality of inputs/outputs (i.e., more than one uni-directional conductor and/or more than one bi-directional conductor)
Figure 1D:
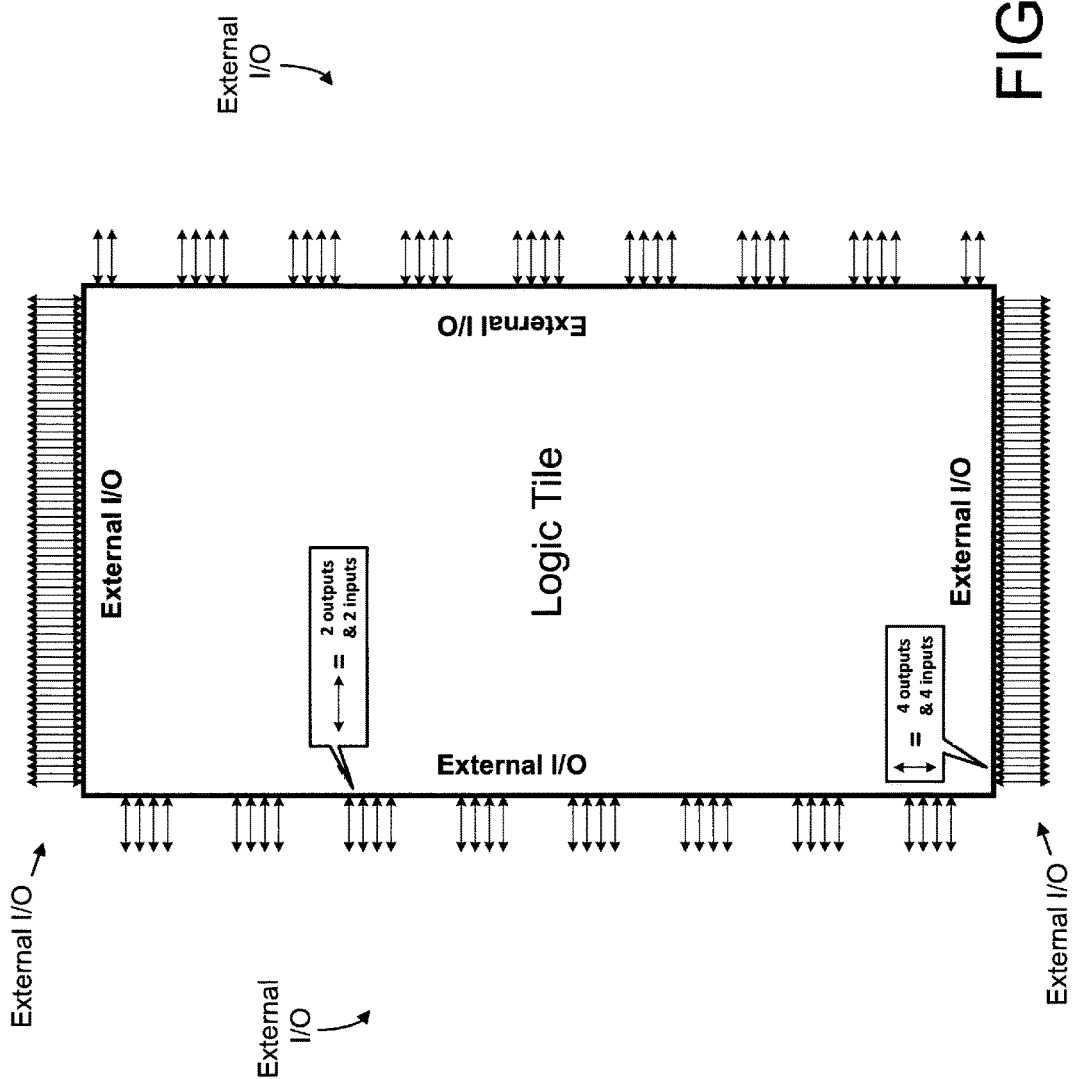
FIG. 1D illustrates a block diagram representation of an exemplary logic tile of the programmable/configurable logic circuitry of FIGS. 1A-1C wherein external I/O of the logic tile (which, in one embodiment, are electrically coupled to I/O circuitry or blocks) in this exemplary embodiment are located on all sides of the rectangular-shaped logic tile (i.e., interspersed along the entire perimeter of the logic tile); each of the logic tiles of the physical array have a common layout of the external I/O on the perimeter or periphery of the logic tile; notably, the external I/O are separate from or independent of the I/O of the logic tile employed for internal interconnect of the network within the logic tile and/or between logic tiles of the physical array of the programmable/configurable logic circuitry.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein. Moreover, for the purposes of clarity, I/O (e.g., external I/O and virtual I/O), clocking features, and/or memory are not illustrated in all of the exemplary embodiments of the Figures. For the avoidance, however, the exemplary embodiments described and illustrated herein (e.g., FIGS. 3A-3C, 4A-4D and 8A-8E) may employ any I/O architectures or embodiments (see, e.g., FIGS. 1C, 1D, 2B-2D and 7B), switch interconnect network architectures or embodiments (see, e.g., FIG. 7A), clocking architectures or embodiments (see, e.g., FIGS. 2B-2D, 5A and 5B) and/or memory architectures or embodiments (see, e.g., FIGS. 2B-2D and 7C) described and illustrated herein.

DETAILED DESCRIPTION

In a first aspect, the present inventions relate to an integrated circuit including an FPGA having a physical array of logic tiles (e.g., contiguous logic tiles) that are functionally and/or operationally "partitioned" to form a plurality of virtual arrays of logic tiles wherein each virtual array includes one or more logic tiles. The virtual arrays of physical array of logic tiles may be, for example, a physically contiguous subset of logic tiles of the physical array of logic tiles. The virtual arrays of logic tiles may be a physically contiguous or non-contiguous subset of logic tiles of the physical array of logic tiles. The virtual arrays of logic tiles may be programmed, configured or defined to implement one or more particular and/or predetermined functions/operations such as, for example, a data processor or a microcontroller (e.g., a DSP and associated logic circuitry). The virtual arrays may also be programmed/configured/defined to implement other particular and/or predetermined functions/operations such as logic (e.g., to interface with a first virtual array which is a processor or controller), an accelerator, a data encryption engine, a filter, an encoder, a DSP (implementing, for example, one or more multiplier-accumulator circuits and/or operations), a state machine and/or memory with an interconnect network. Notably, the number of logic tiles associated with or partitioned to each virtual arrays may be the same as or different from other virtual arrays of the physical array of logic tiles of the FPGA.

The virtual arrays of logic tiles may be programmed, configured and/or defined to operate or perform (i) independently from one or more (or all) of the other virtual arrays, (ii) fully or partially independently during all or a portion of the operation of the FPGA, or (iii) with or dependently on one or more (or all) of the other virtual arrays. Indeed, in one embodiment, one or more of the virtual arrays of logic tiles may be programmed, configured or defined to operate or perform its function independently from one or more of the other virtual arrays and one or more other virtual arrays of logic tiles may be programmed, configured or defined to operate with or dependently on one or more virtual arrays. Notably, all combinations and permutations of independent and dependent operation for each of the virtual arrays of logic tiles are intended to fall within the scope of the present inventions.

With reference to FIGS. 1A-1D, briefly, in one embodiment, the FPGA of the present inventions includes, among other things, programmable/configurable logic circuitry which includes a physical array of logic tiles. As mentioned above, each logic tile typically includes thousands of transistors which may be configured to perform combinational and/or sequential functions (simple and/or complex). In one embodiment, each logic block may include one or more multiplexers or switches which may be arranged in a plurality of switch matrix or switch matrices stages of an interconnect network, to, for example, perform logic operations in or during normal operation of the integrated circuit (based on that current configuration of the logic block(s)) and (ii) I/O (I/O pins and associated I/O circuitry or blocks)—for example, I/O pins, disposed on the periphery, perimeter or edge of the logic tile, and I/O circuitry or blocks associated with such I/O pins, to facilitate interconnection between circuitry of the logic tile and circuitry external to the programmable/configurable logic circuitry. Notably, the external I/O (I/O pins and associated I/O circuitry/blocks) of each logic tile are commonly interspersed along the entire perimeter or border of the logic tile—for example, in those situations where the logic tile has a square or rectangle shape, on all four sides. (See, e.g., FIG. 1D). Thus, in one embodiment, each logic tiles of the logic tile array has a common external I/O layout on the perimeter of the logic tile (which advantageously facilitates the tiling of the logic tiles of the physical array).

In one aspect of the present inventions, the physical array of logic tiles of the present inventions is functionally or operationally "partitioned" to form a one or more virtual arrays of logic tiles (each virtual array including one or more physical logic tiles). The virtual array of logic tile(s) is/are programmed, configured or defined to implement a specific function/operation such as, for example, a data processor, a microcontroller, logic (e.g., to interface with another virtual array (e.g. is a processor or controller), an accelerator, a data encryption engine, a filter, a DSP, an encoder, and/or a state machine. For example, with reference to FIGS. 2A-2D, in one embodiment, the physical array of logic tiles of the programmable/configurable logic circuitry is partitioned into two virtual arrays, each virtual array including one or more physical logic tiles. In this embodiment, Virtual Array 1 and Virtual Array 2 each include a physically contiguous subset of logic tiles of the physical array of logic tiles. Virtual Array 1 is programmed/configured/defined to implement function $f(1)$ (e.g., a data processor or a microcontroller (e.g., a DSP with supporting logic circuitry)) and Virtual Array 2 is programmed/configured/defined to implement $f(2)$ (e.g., support logic (e.g., to interface with a first virtual array which is a processor or controller), an accelerator, a data encryption engine, a filter, an encoder, a state machine and/or memory with an interconnect network). M logic tiles of the physical array of logic tiles are associated with or functionally or operationally partitioned to form Virtual Array 1, and N logic tiles of the physical array of logic tiles are associated with or functionally or operationally partitioned to form Virtual Array 2—wherein M and N are positive integers (i.e., 1, 2, 3, . . . ) which may be the same integer or different integers.

Notably, the physical array of logic tiles may functionally or operationally "partitioned" into subsets of the entire physical array to form more than two virtual arrays of logic tiles. (See, e.g., FIGS. 3A-3C). Each virtual array may be designed, configured or defined to implement one or more (or all) unique or non-unique functions or operations. Indeed, although many of the embodiments describe a virtual array as programmed, configured or defined to implement or perform a function, that function may be a singular function/operation or a plurality of related or unrelated functions/operations (e.g., a combination of related functions/operations).

Moreover, the physical array of logic tiles and/or the virtual arrays of logic tiles may be any size (row or column) and/or shape (i.e., row vs. column). For example, with reference to FIGS. 3A-3C, the physical array of a plurality of logic tiles may be arranged into X number of virtual arrays (where X is a positive integer), including Virtual Array 1 (having M logic tiles where M is a positive integer) is programmed, configured or defined to implement function/operation $f(1)$, Virtual Array 2 (having N logic tiles where N is a positive integer) is programmed/configured/ defined to implement function/operation $f(2)$, etc., and Virtual Array X (having Y logic tiles where Y is a positive integer) is programmed/configured/defined to implement function/operation $f(x)$. As noted above, such functions may be the one or more (or all) unique or non-unique functions or operations. notably, each virtual arrays may be comprised of the same or different number of physical logic tiles and may be organized, in relation to the physical array of logic tiles of the programmable/configurable logic circuitry, in any manner including, for example, in columns (see, FIG. 3A wherein the virtual arrays are partitioned/organized in a column-wise manner relative to the physical array), rows (see, FIG. 3B wherein the virtual arrays are partitioned/ organized in a row-wise manner relative to the physical array), and rows and columns (see, FIG. 3C wherein the virtual arrays are neither partitioned/organized in a column-wise nor row-wise manner relative to the physical array). Notably, although each of the virtual arrays may be illustrated as including a plurality of contiguous logic tiles, the virtual arrays may also include one or more non-contiguous logic tiles (i.e., a virtual array having one or more logic tiles that are not contiguous with other logic tiles of that virtual array).

With reference to FIGS. 2A-2D and 3A-3C, one or more (or all) of the virtual arrays of logic tiles may be programmed/configured/defined to operate independently from one or more (or all) of the other virtual arrays. For example, with reference to FIGS. 2A, and 3A-3C, Virtual Array 1 may operate fully or partially independently, relative to Virtual Array 2, during all or a portion of the operation of the FPGA. Moreover, in one embodiment, Virtual Array 1 may be programmed, configured or defined to operate independently from Virtual Array X and operate dependently on Virtual Array 2. (See, e.g., FIGS. 3A and 3C). Notably, all combinations and permutations of independent and dependent operation for each of the virtual arrays of logic tiles are intended to fall within the scope of the present inventions.

Figure 2A:
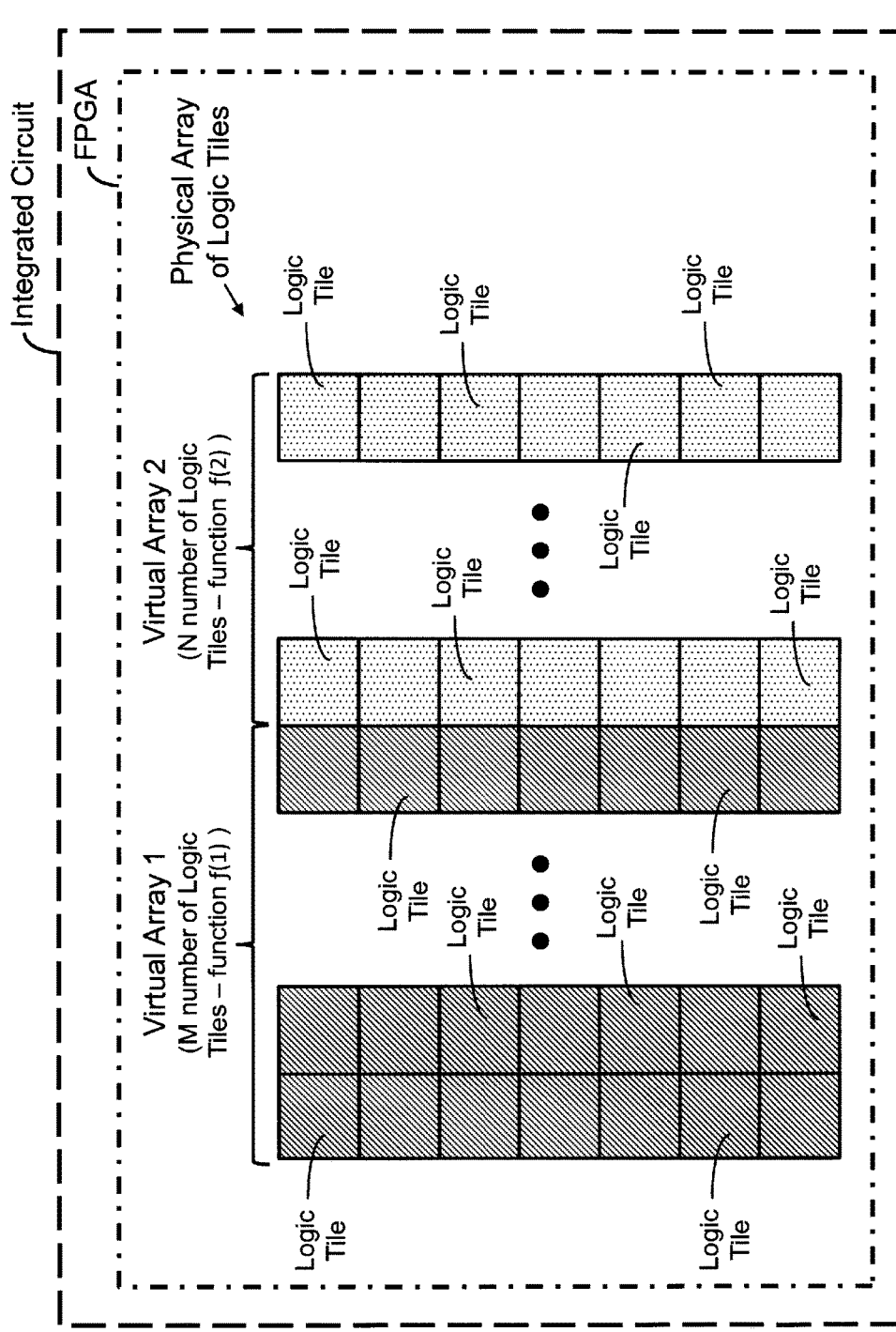
FIGS. 2A-2D illustrate, in block diagram form, exemplary embodiments of an FPGA including programmable/configurable logic circuitry having a physical array of a plurality of logic tiles functionally or operationally "partitioned" or arranged into a plurality of virtual arrays, in accordance with certain aspects of the present inventions, wherein in these illustrative exemplary embodiments, the physical array of a plurality of logic tiles is arranged into two virtual arrays including Virtual Array 1, a first virtual array of logic tiles (having M logic tiles where M is a positive integer), which is programmed/configured/defined to implement a first function/operation, and Virtual Array 2, a second virtual array of the logic tiles (having N logic tiles where N is a positive integer) which is programmed/configured/defined to implement a second function/operation (see, FIG. 2A); notably, the Virtual Arrays 1 and 2 receive separate/distinct clock signals and/or common clock signals, include separate external I/Os to communicate with circuitry external to the FPGA; and communicate with each other via Virtual I/O (see, FIGS. 2B and 2C) and/or an interconnect network (see, FIGS. 2C and 2D); such interconnect network may be implemented in the manner described and illustrated in U.S. Pat. No. 9,503,092, for example, a mixed-mode architecture including a hierarchical network and a mesh network and, in one embodiment, the virtual arrays are interconnected via a configurable mesh interconnect network (e.g., which, in one embodiment, is the highest stage of the mixed-mode switch interconnect architecture); as noted, the logic tiles of a virtual array may communicate data and control signals to a logic tile of another virtual array (e.g., an adjacent virtual array) via Virtual I/O; in one embodiment, Virtual I/O are "unused" external I/O of the logic tile (see, FIGS. 1C and 1D) that located on a perimeter of the logic tile which physically opposes a perimeter of an adjacent logic tile of the adjacent virtual array wherein such external I/O are "unused" when the perimeter of the logic tile upon which the external I/O are located on a periphery or perimeter of the virtual array and interior to the periphery or perimeter of the logic tile array of programmable/configurable logic circuitry (i.e., the perimeter of the logic tile is not located on the periphery or perimeter of the programmable/configurable logic circuitry (and, as such are not employed to connect to circuitry external to the logic tile array)); indeed, an external I/O of a logic tile may be unused or disabled even if on the periphery or perimeter of the programmable/configurable logic circuitry; the Virtual I/O may be configured or employed to electrically connect to Virtual I/O on adjacent/opposing logic tiles of the programmable/configurable logic circuitry; thus, in this exemplary embodiment, such Virtual I/O are unused external I/O of adjacent/opposing logic tiles (i.e., I/O that are available to connect to and communicate with circuitry external to the logic tile array if such I/O were located on the periphery or perimeter of the programmable/configurable logic circuitry) that are employed to provide direct communication between logic tiles—which, in these embodiments are adjacent virtual array.
Figure 2B:
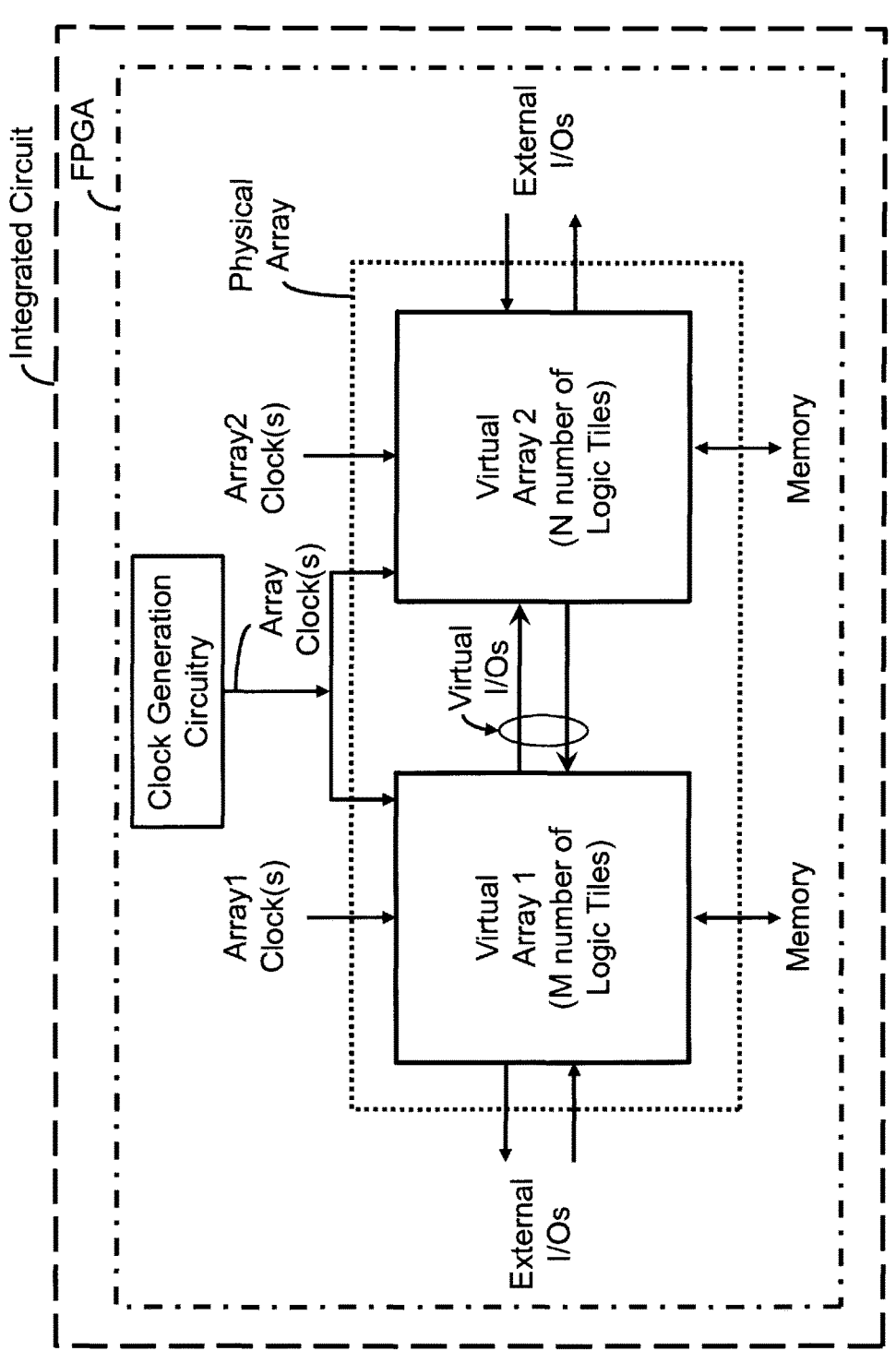
Figure 2C:
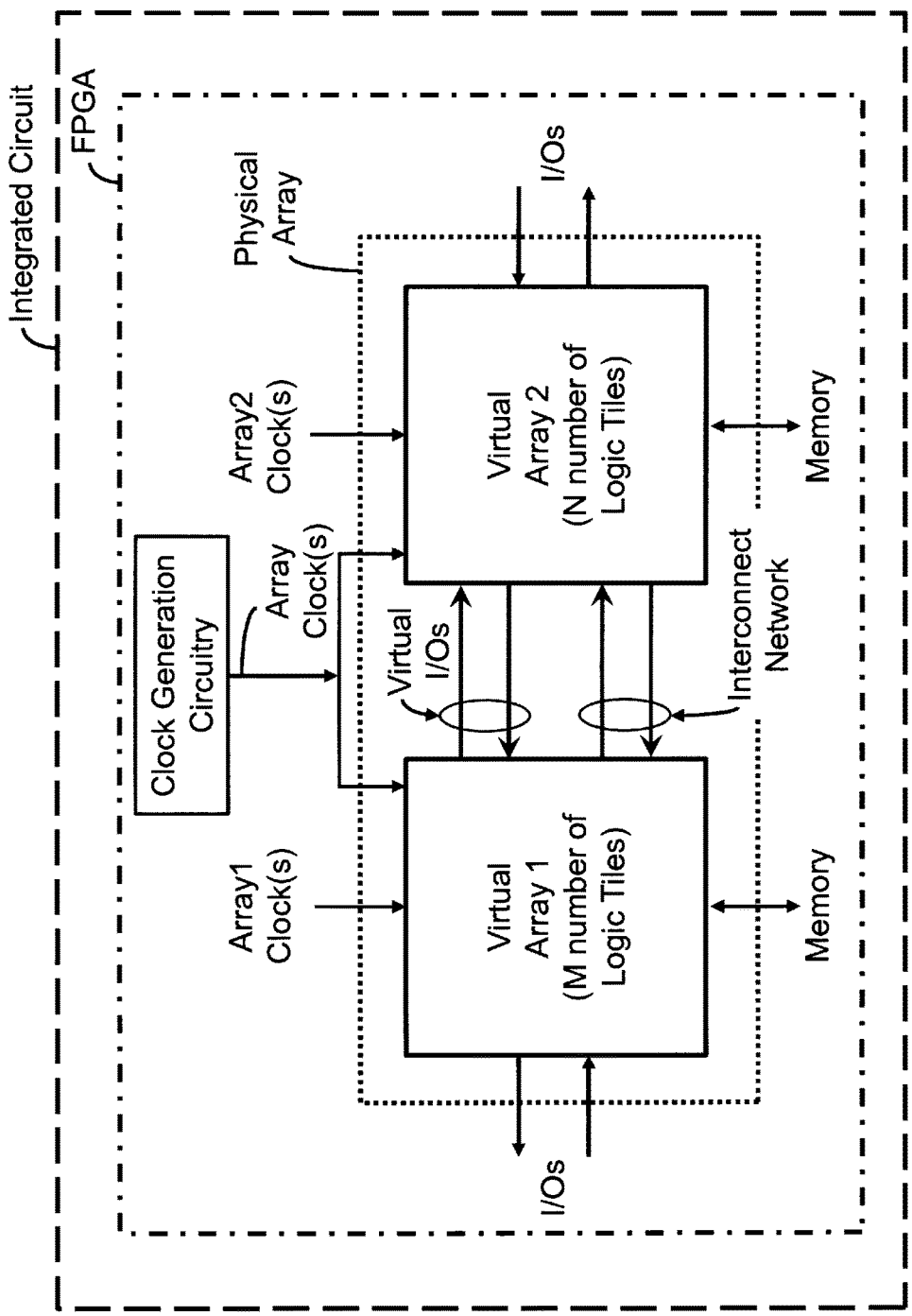
Figure 2D:
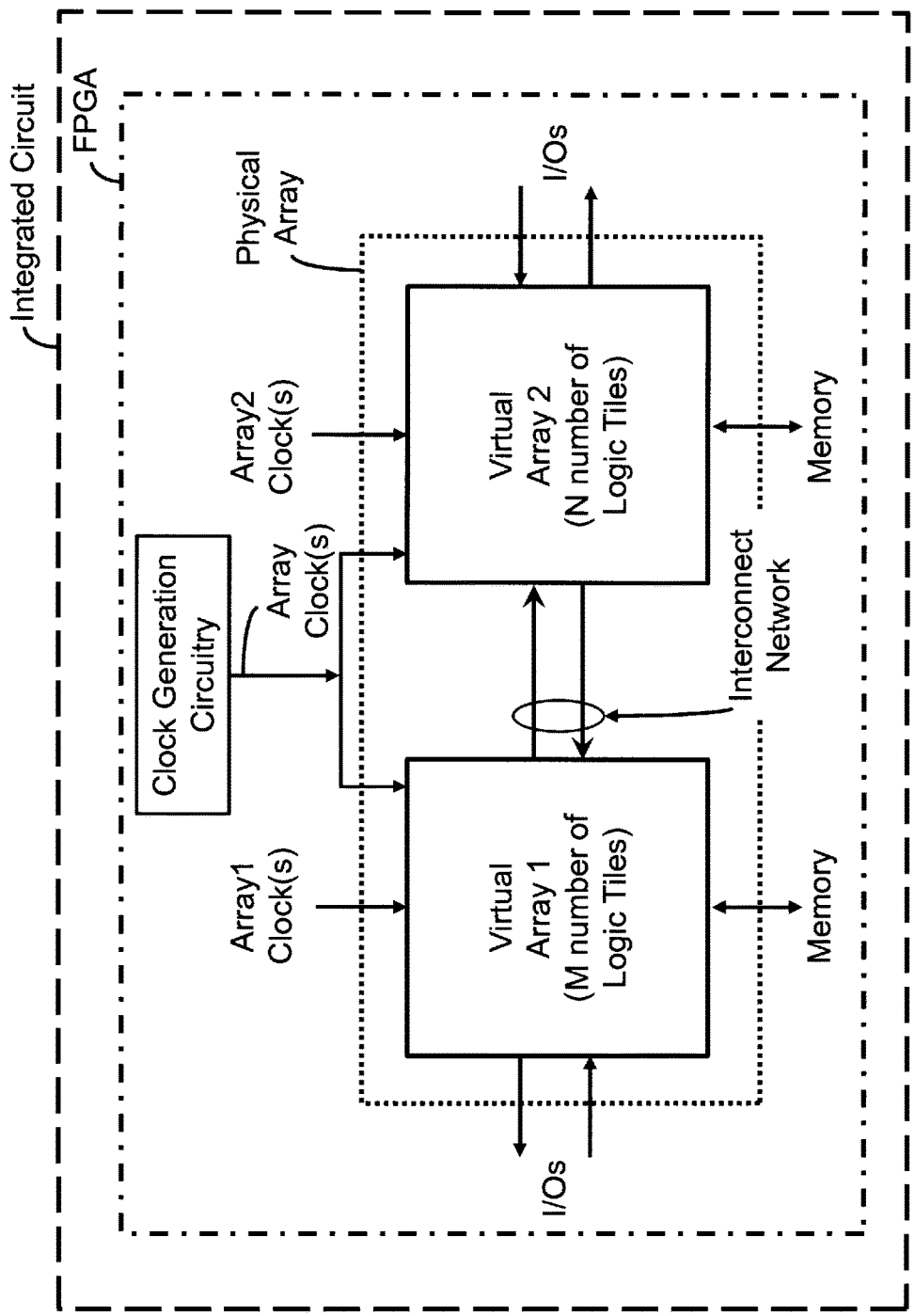
Figure 3A:
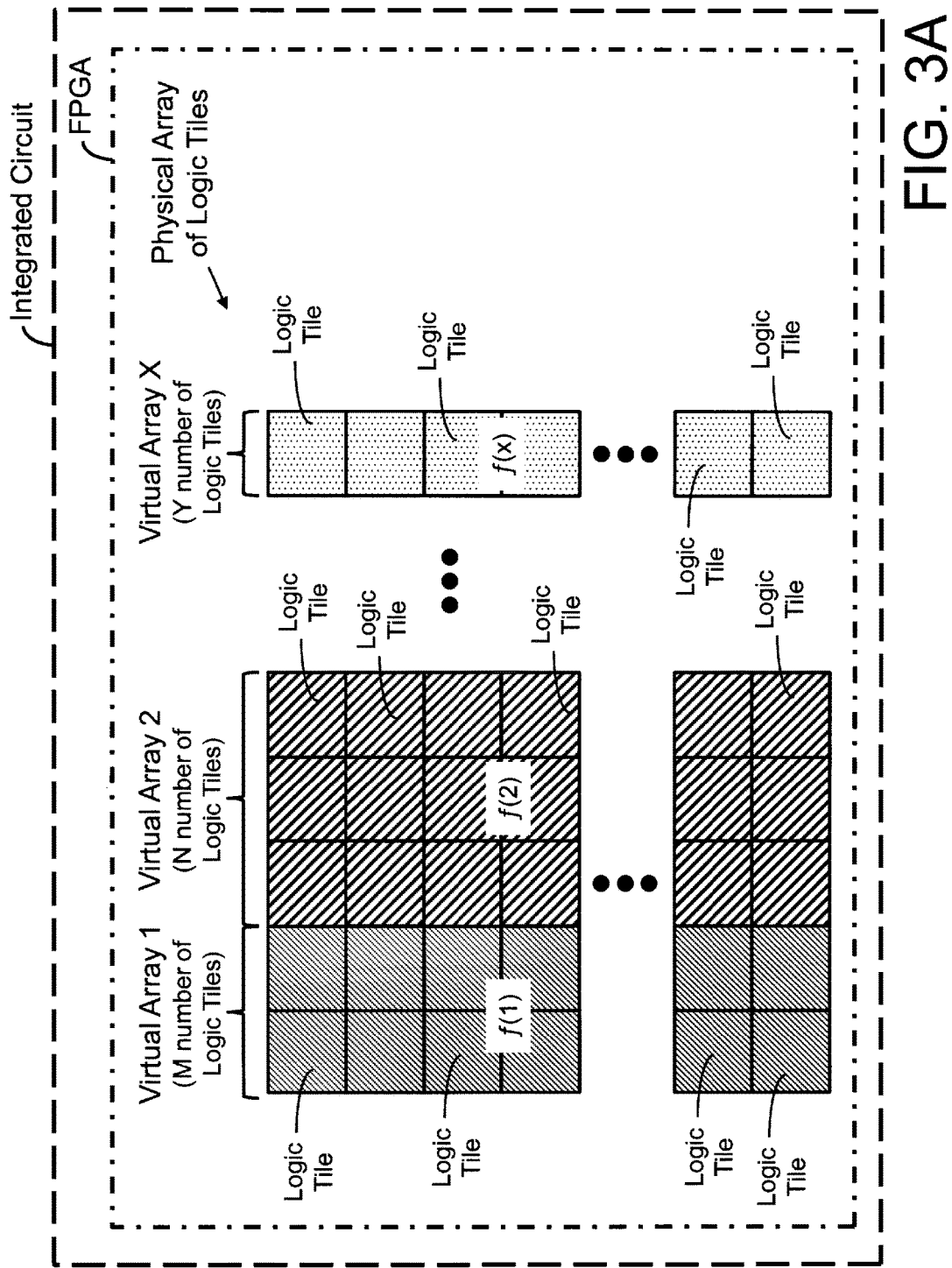
FIGS. 3A-3C illustrate, in block diagram form, exemplary embodiments of an FPGA including programmable/configurable logic circuitry having a physical array of a plurality of logic tiles functionally or operationally "partitioned" or arranged into a plurality of virtual arrays of physical logic tiles (in the exemplary embodiments illustrated here, more than two virtual arrays), in accordance with certain aspects of the present inventions; the physical array of a plurality of logic tiles may be arranged into X number of virtual arrays (where X is a positive integer), including a first virtual array of logic tiles (having M logic tiles where M is a positive integer) which is programmed/configured/defined to implement Virtual Array 1, a first function/operation $f(1)$, Virtual Array 2, a second virtual array of the logic tiles (having N logic tiles where N is a positive integer) which is programmed/configured/defined to implement a second function/operation $f(2)$, etc., and Virtual Array X, a virtual array of the logic tiles (having Y logic tiles where Y is a positive integer) which is programmed/configured/defined to implement a second function/operation $f(x)$ (see, FIG. 3A); notably, each virtual array may be comprised of the same or different number of physical logic tiles and may be organized, in relation to the physical array of logic tiles of the programmable/configurable logic circuitry, in any manner including, for example, in columns (see, FIG. 3A), rows (see, FIG. 3B), and rows and columns (see, FIG. 3C); moreover, the virtual arrays may (i) receive separate/distinct clock signals and/or common clock signals, (ii) include separate External I/Os (to communicate with circuitry external to the FPGA) and (iii) communicate with each other via Virtual I/Os and/or a switch matrix interconnect network (see, e.g., FIGS. 2B-2D and the description relating thereto)
Figure 3B:
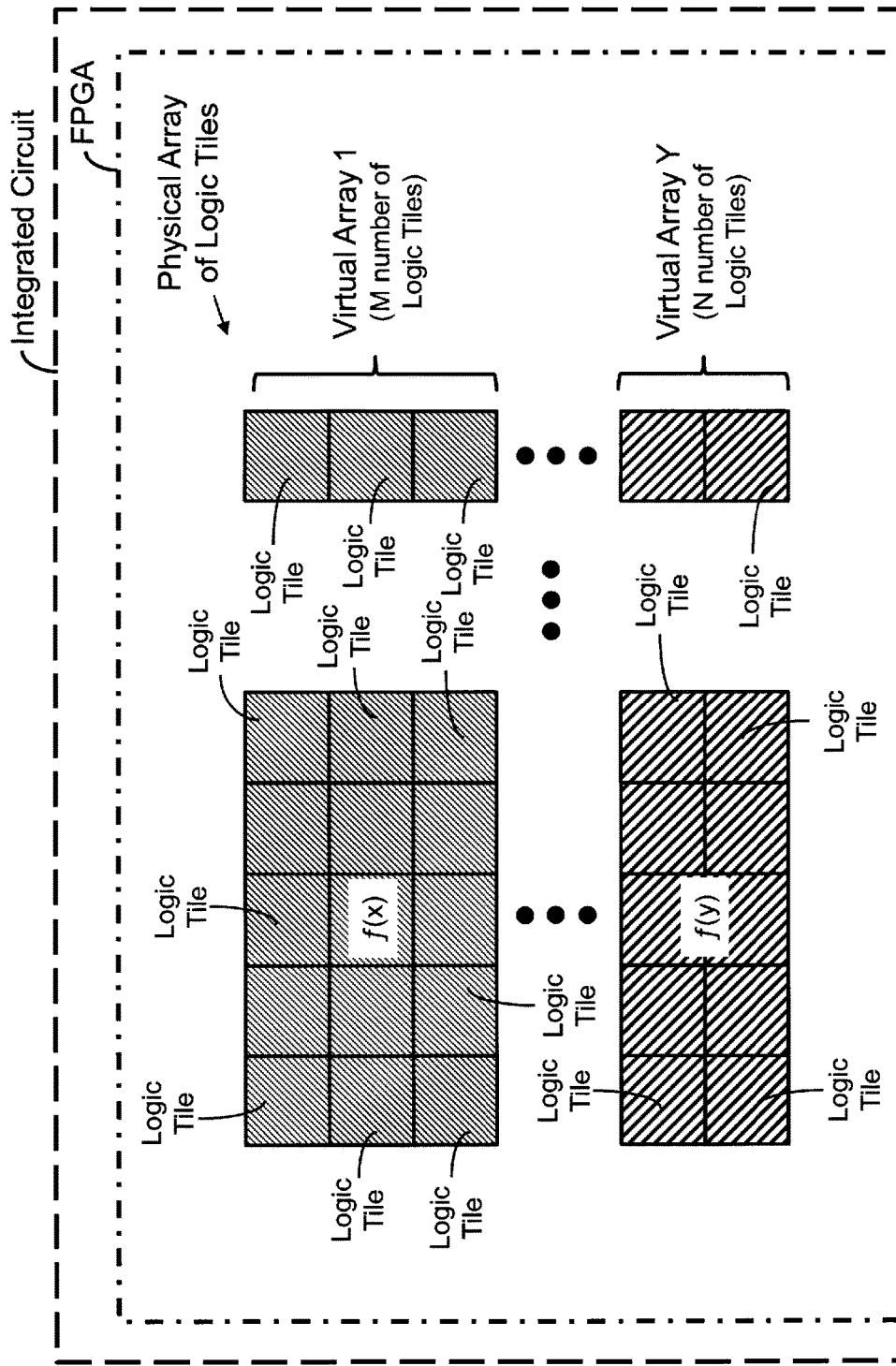
Figure 3C:
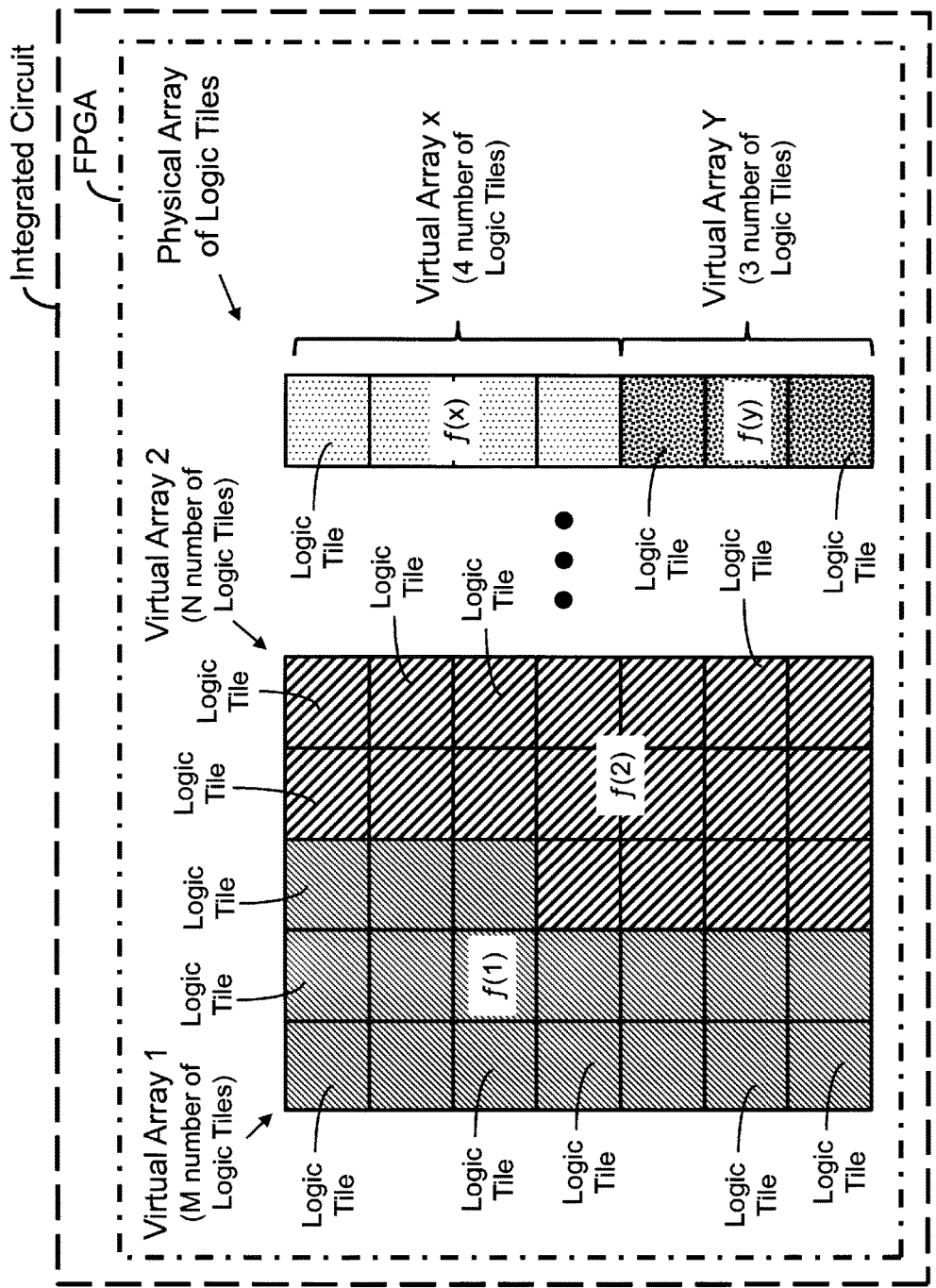
Figure 4A:
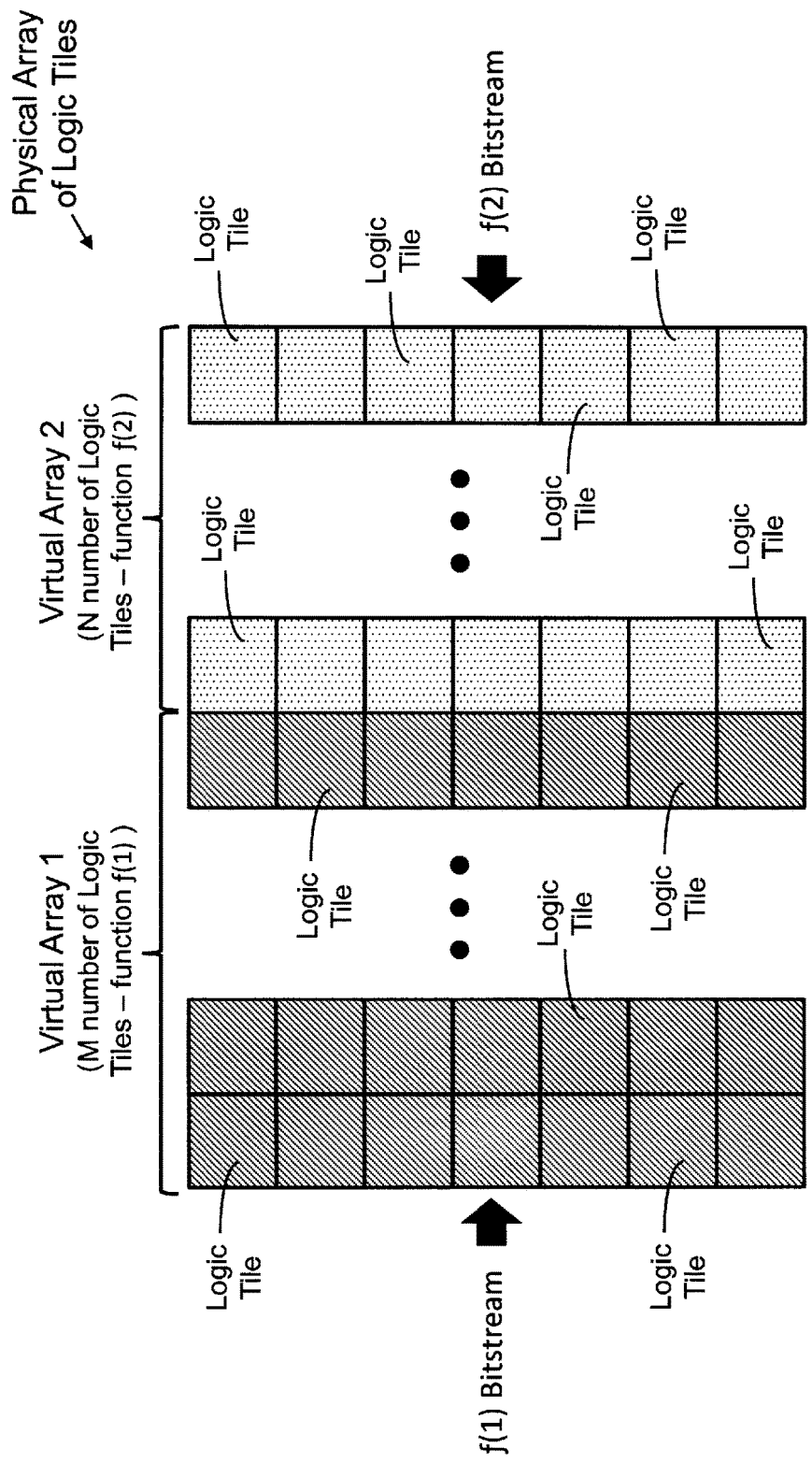
FIGS. 4A-4D illustrate, in block diagram form, exemplary embodiments of a physical array of a plurality of logic tiles of programmable/configurable logic circuitry of an FPGA wherein the physical array of a plurality of logic tiles are functionally or operationally "partitioned" or arranged into a plurality of virtual arrays of physical logic tiles, in accordance with certain aspects of the present inventions, wherein the physical array of logic tiles, including the one or more of the virtual arrays of logic tiles, may be configured via a compiler separately generating a plurality of bitstreams (which is designed to implement a given function/operation $f(i)$), wherein each bitstream is representative of or corresponds to configuration data of the associated virtual array of logic tiles, and thereafter generating a compiled or composite bitstream, which, when executed or implemented, configures the physical array of logic tiles of the FPGA including each of the virtual arrays of physical logic tiles; specifically, in relation to FIG. 4A, a compiler generates $f(1)$, $f(2)$ bitstreams and, in one embodiment, subsequently generates a combined or composite bitstream of $f(1)+f(2)$ that is used to configure or program the physical array of logic tiles of the FPGA; in relation to FIG. 4B, a compiler generates $f(1), f(2) \ldots f(x)$ bitstreams and, in one embodiment, subsequently generates a combined or composite bitstream of $f(1)+f(2)+ \ldots +f(x)$ that is employed to configure or program the physical array of logic tiles of the FPGA; in relation to FIG. 4C, a compiler generates $f(1), \ldots, f(y)$ bitstreams and subsequently generates a combined or composite bitstream of $f(1)+ \ldots +f(y)$ that is used to configure or program the physical array of logic tiles of the FPGA; and, in relation to FIG. 4D, a compiler generates $f(1), f(2) \ldots f(x), f(y)$ bitstreams and, using such bitstreams, generates a combined or composite bitstream of $f(1)+f(2)+ \ldots +f(x)+f(y)$ that is employed to configure or program the physical array of logic tiles of the FPGA; notably, the function/operation $f(i)$ of a virtual array of physical logic tiles may be a singular function/operation or a plurality of functions/operations including a combination of related or unrelated functions/operations (all permutations and combinations thereof are intended to fall within the scope of the present inventions); moreover, for the purposes of clarity, I/O (e.g., external I/O and virtual I/O), clocking features, and/or memory are not illustrated, however, the exemplary embodiments may employ any I/O architecture (see, e.g., FIGS. 1C, 1D and 2B-2D), clocking architecture (see, e.g., FIGS. 2B-2D, 5A and 5B) and/or memory architecture (see, e.g., FIGS. 2B-2D and 7C) described and illustrated herein.
Figure 4B:
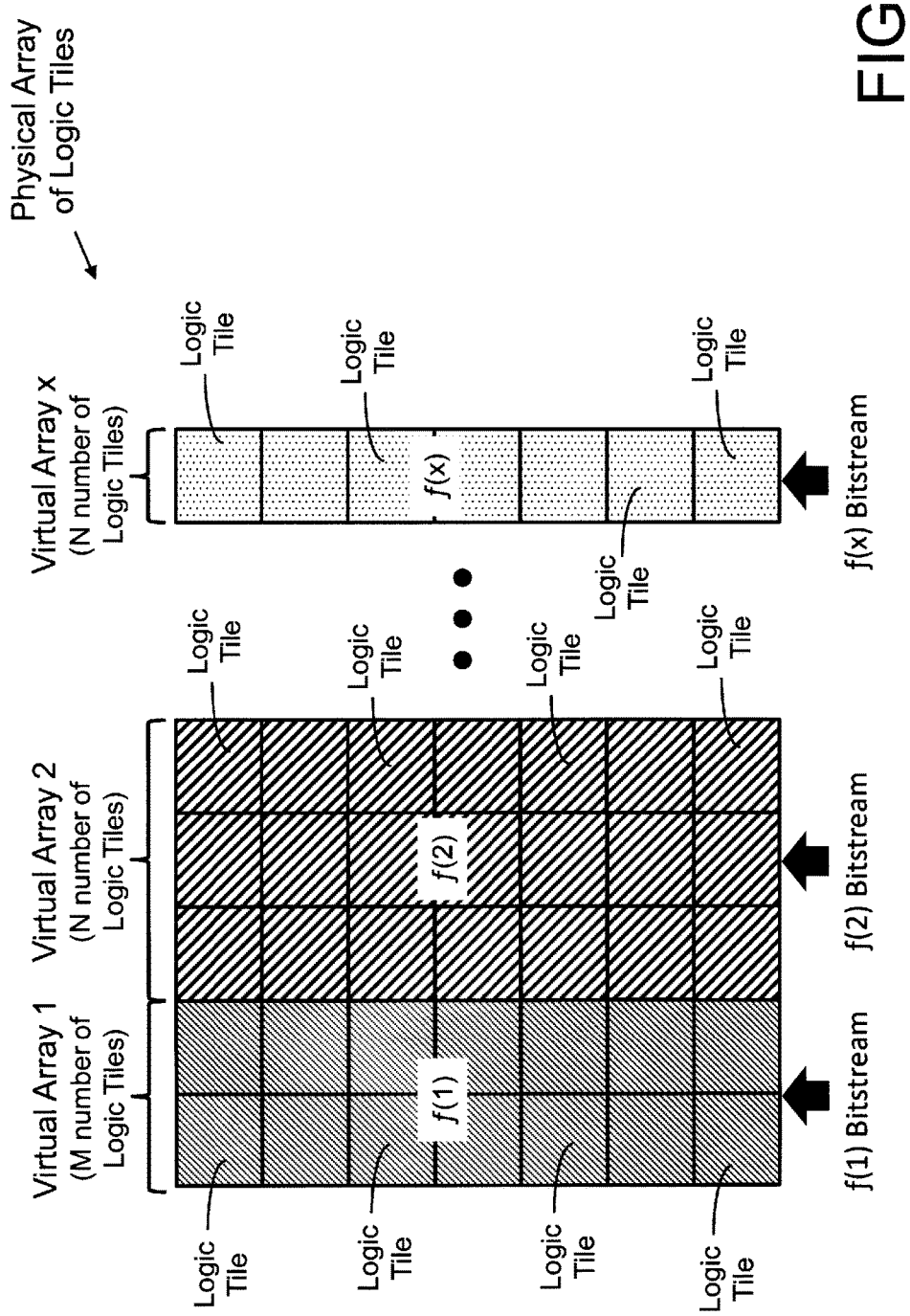
Figure 4C:
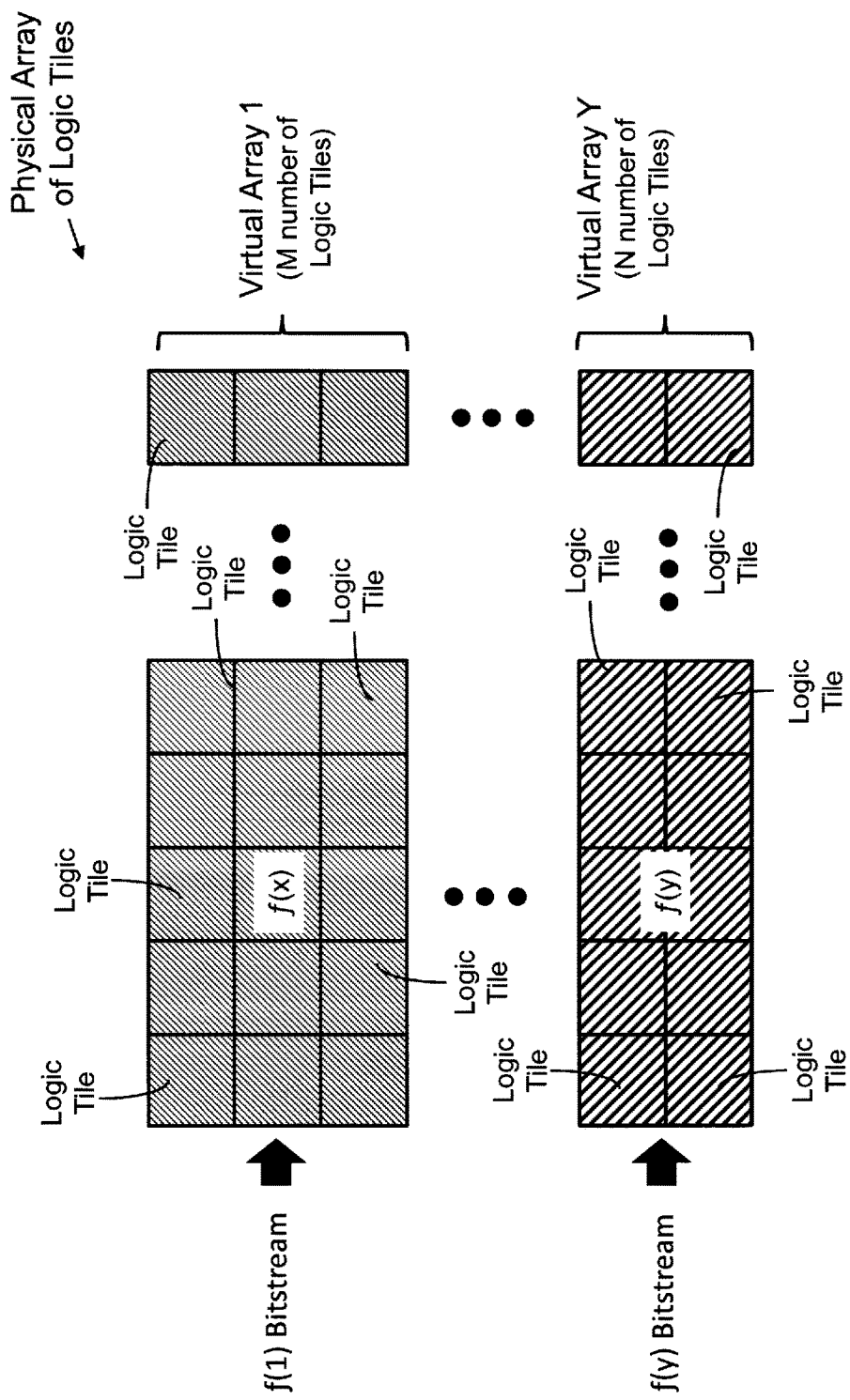
Figure 4D:
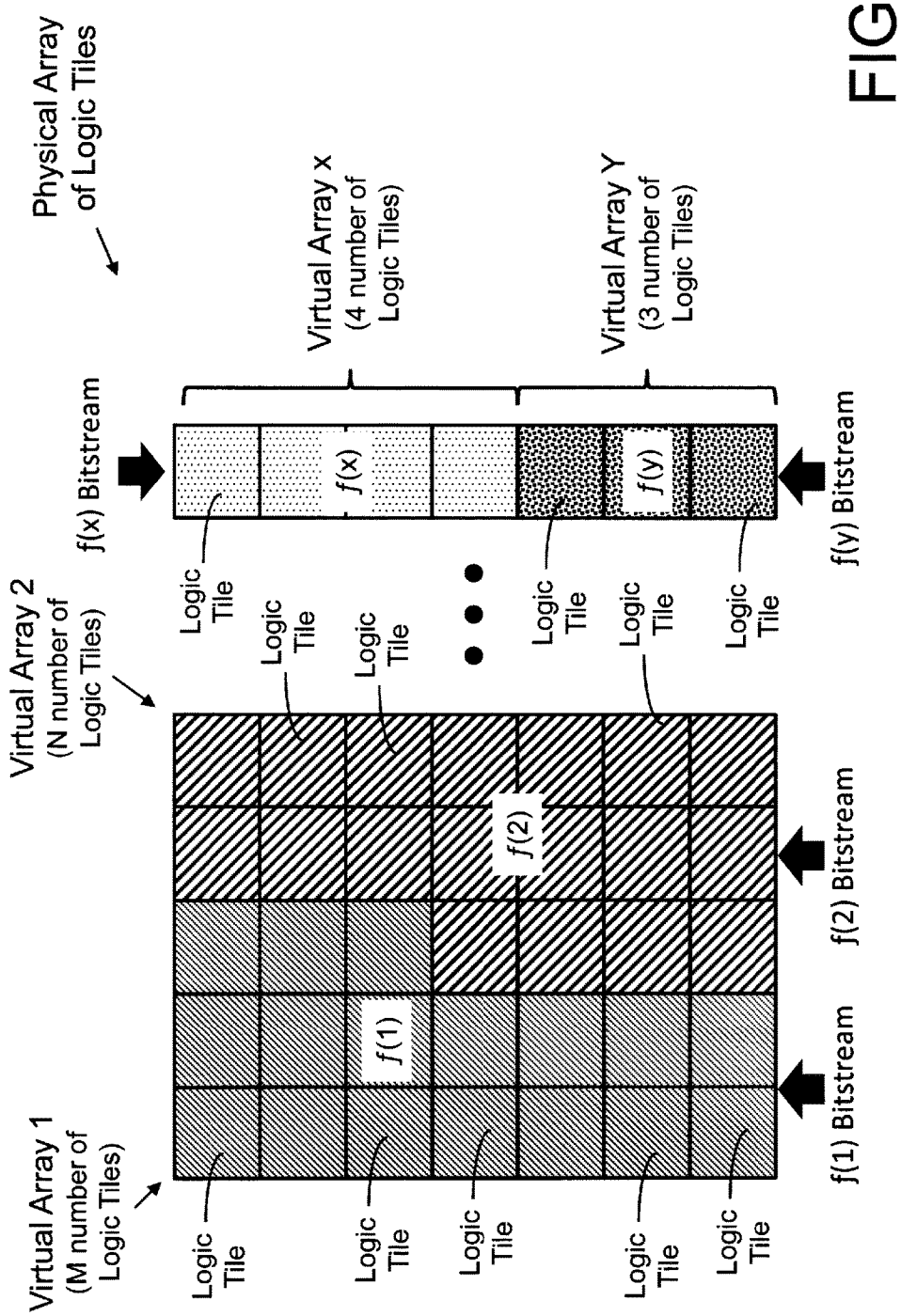

With reference to FIGS. 2B-2D, the virtual arrays of logic tiles may include, receive, generate and/or employ one or more unique signals (or clock domains) and/or non-unique clock signals (or clock domains) relative to clock signals received, generated and/or employed by other virtual array(s). For example, Array 1 Clock(s) (which is received and employed by Virtual Array 1) may be the same or different characteristics (e.g., frequency and/or phase) as the characteristics of Array 2 Clock(s) (which is received and employed by Virtual Array 2). In addition thereto, or in lieu thereof, two or more (or all) of the virtual arrays may generate and/or employ one or more common clock signals (or common clock domains) to, for example, facilitate synchronous operation (e.g., between circuitry of such virtual arrays or between circuitry of such virtual arrays and external circuitry). (See, e.g., Array Clock(s) in FIG. 2B)). Indeed, two or more (or all) of the virtual arrays may employ a common clock signal (or common clock domain) and one or more virtual arrays of logic tiles may include, generate and/or employ different clock signal(s) (or different clock domain(s)). Notably, all combinations and permutations of one or more different clock signals (or different clock domains) and one or more common clock signals (or common clock domains) in relation to the use and generation, on a virtual array-by-virtual array basis, are intended to fall within the scope of the present inventions.

The logic tiles of the virtual arrays may directly communicate with one or more logic tiles of other virtual arrays of logic tiles. With reference to FIGS. 2B and 2C, in one embodiment, the logic tiles of one or more virtual arrays may communicate (e.g., data, control and/or address signals) with other logic tiles (e.g., one or more logic tiles of one or more different virtual arrays), using Virtual I/O—which, in one embodiment, are "unused" external I/O of the logic tile (see, FIGS. 1C and 1D) that located on a perimeter of the logic tile which physically opposes a perimeter of an adjacent logic tile of, for example, an adjacent virtual array. Such external I/O are "unused" when the I/O is not employed to communicate with circuitry external to the FPGA or the programmable/configurable logic circuitry (e.g., when the external I/O of the logic tile is not located on periphery or perimeter of the physical array of logic tiles (i.e., the perimeter of the logic tile upon which the external I/O are located on a periphery or perimeter of the virtual array and interior to the periphery or perimeter of the logic tile array of programmable/configurable logic circuitry). In those instances where the external I/O are located on the on a periphery or perimeter of the virtual array and interior to the periphery or perimeter of the logic tile array, the "unused" external I/O may be repurposed as Virtual I/O which may be configured or employed to electrically connect to unused external I/O on adjacent/opposing logic tiles of the programmable/configurable logic circuitry (e.g., Virtual I/O of an adjacent Virtual Array). Here, such Virtual I/O are employed to provide direct communication between logic tiles of the physical array of logic tiles—which, in this embodiment are logic tiles of adjacent virtual arrays.

Thus, in one embodiment, Virtual Array 1 and Virtual Array 2 include Virtual I/O to connect to or facilitate communication therebetween. (See also, Logic Tiles 00 and 01 of FIG. 7B). Such Virtual I/Os may transmit/receive control, address and/or data signals between the logic tiles of Virtual Arrays 1 and 2 (as well as between other logic tiles of the physical array). For example, in one embodiment, the Virtual I/Os provide or facilitate a communication path to (i) input data (a) to use in the function or operation (such as, of a data processor, microcontroller, an accelerator, a data encryption engine, a filter, a DSP, an encoder, and/or a state machine) and/or (b) upon which the function or operation is to be performed (e.g., encryption) and/or (ii) output data after performance of a function or operation performed by the virtual array of logic tiles (e.g., an encryption operation)

Notably, one, some or all of the external I/O of one or more logic tiles (whether or not the logic tile(s) is/are of a virtual array) may be "unused" notwithstanding such external I/O are located on periphery or perimeter of the physical array of logic tiles. Here, the external I/O is/are not employed to communicate with circuitry external to the physical array of logic tiles. Indeed, in one embodiment, a virtual array does not directly communicate with circuitry external to the programmable/configurable logic circuitry and, as such, has no external I/O. In this embodiment, the virtual array of logic tiles may communicate directly with other logic tiles of the physical array (e.g., logic tiles of another virtual array) via virtual I/O and/or an interconnect network or fabric.

With reference to FIGS. 2C and 2D, in addition to the Virtual I/O, or in lieu thereof, in one embodiment, one or more virtual arrays of logic tiles may communicate with one or more other virtual arrays of logic tiles using an interconnect network or fabric. Such switch interconnect network or fabric may be configured, for example, at power-up, start-up, during initialization or re-initialization, and/or at reset or like sequence/operation (which may be before, during/concurrently or after configuration of the virtual array of logic tiles). In one embodiment, one or more logic tiles of a virtual array may be interconnected with one or more logic tiles of another virtual array based on or using one or more of the networks described and/or illustrated in U.S. Pat. No. 9,503,092 (which is incorporated herein by reference). Indeed, in addition thereto, or in lieu thereof, one or more (or all) of the logic tiles of a given virtual array may also be interconnected based on or using one or more of the networks described and/or illustrated in U.S. Pat. No. 9,503,092.

Figure 7A:
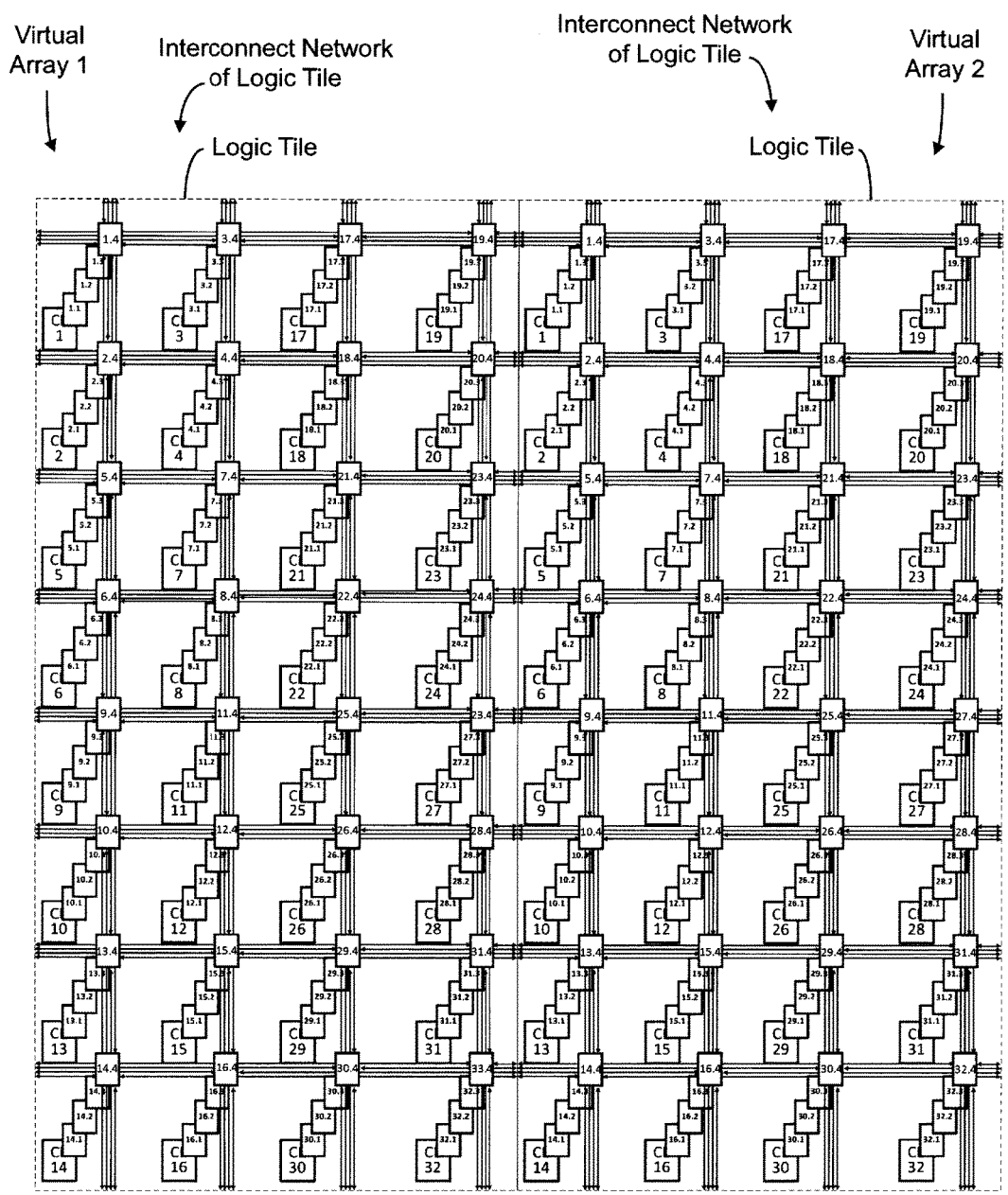
FIG. 7A illustrates, in block diagram form, the mesh connections of Stage 4 of a portion of the exemplary embodiment of FIGS. 2A, 2C and 2D wherein, in one embodiment, the interconnect networks of the virtual arrays are connected via a configurable mesh, torus or the like interconnect network (hereinafter "mesh network"), for example, as implemented in a manner described and illustrated in U.S. Pat. No. 9,503,092 (which is incorporated herein by reference in its entirety); in this illustrative exemplary embodiment, the highest stage of the mixed-mode switch interconnect architecture is a mesh interconnect (here, a plurality of switch matrices of the highest stage of a logic tile of Virtual Array 1 is connected to a plurality of switch matrices of that stage in that logic tile of Virtual Array 1 and one or more switch matrices of the highest stage in at least one logic tile of Virtual Array 2; (indeed, in this illustrative exemplary embodiment, signals output by the switches of Stage 4 do not change hierarchy as such signals propagate through the mesh network; that is, a signal may travel from a switch in Stage 4 of a logic tile of Virtual Array 1, then to switch in stage 4 of the logic tile of Virtual Array 2, and then back to a switch in stage 4 of a logic tile of Virtual Array 1; notably, in one embodiment of FIG. 7A hierarchical networks/interconnects are employed in the other switch matrix (SM) stages (i.e., Stages 1, 2 and 3); this notwithstanding, another mesh network/stage may be implemented as a substitute and replacement of one or more of the hierarchical stages (e.g., Stage 2 may be a mesh network or Stages 2 and 4 may be replaced by a mesh network that "hops" horizontally and vertically, in addition to the current Stage 4 mesh that "hops" by 4 in each direction)
Figure 7B:
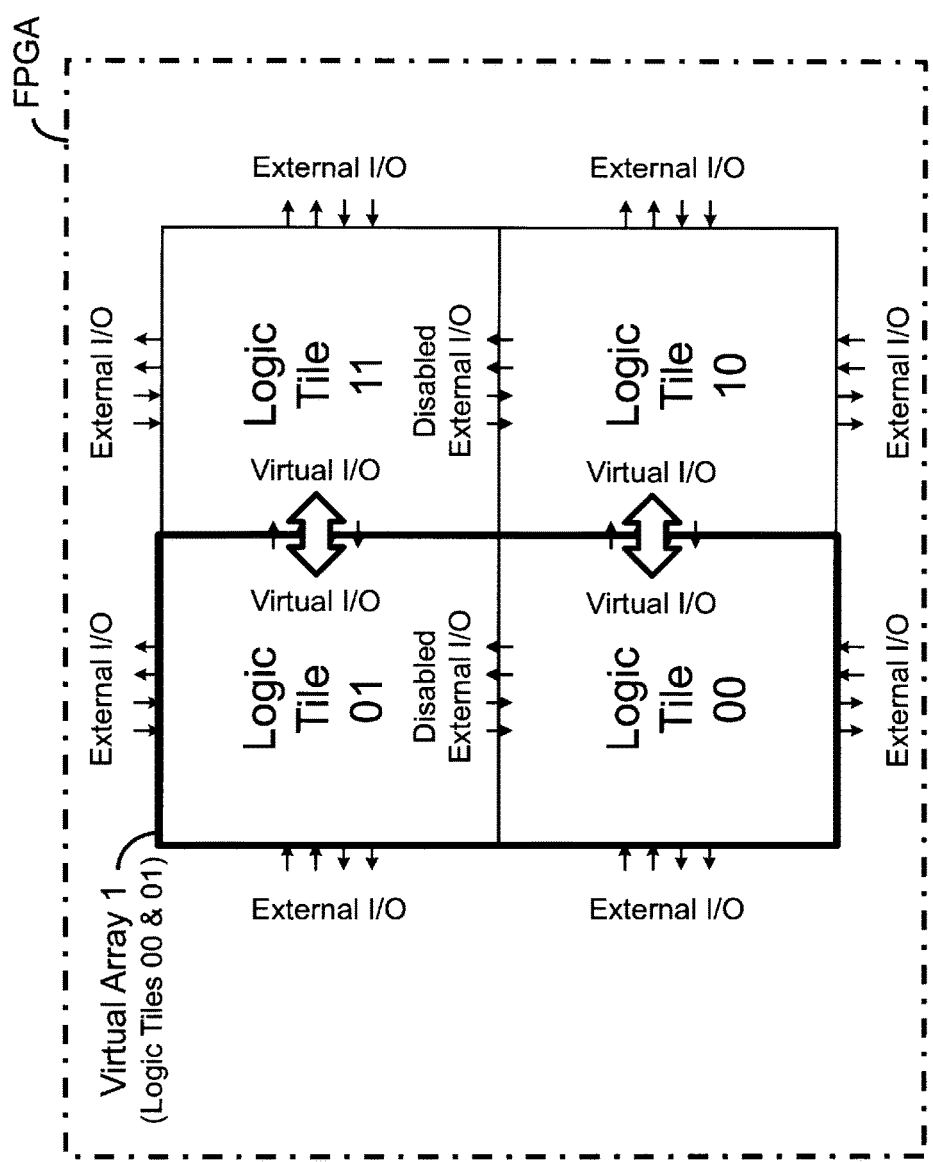
FIG. 7B illustrates, in block diagram form, an exemplary embodiment of a 2×2 physical array including a virtual array consisting of Logic Tile 00 and Logic Tile 01; in the illustrative embodiment, the external I/O between the Logic Tiles 00 and 01 are disabled whereas the external I/O of Logic Tiles 00 and 01 that are juxtaposed Logic Tiles 10 and 11, respectively, are employed as Virtual I/O providing an electrical interface or communication path between the logic tiles of the virtual array and other logic tiles of the physical array; such Virtual I/O may be employed to transmit control signals, data, commands and address information between the logic tiles of the virtual array and other portions of the physical array (such as, for example, to provide or facilitate a communication path between the virtual array that is configured as or to perform operations of a data processor, microcontroller, an accelerator, a data encryption engine, a filter, a DSP, an encoder, and/or a state machine) and other logic tiles of the physical array (which may be part of another virtual array); notably, in this embodiment, Virtual I/O correspond to the external I/O (see, e.g., FIG. 1D) of the logic tiles that are not used to interface with circuitry external to the logic tile array (here, I/O which are not located on a periphery or perimeter of the virtual array or physical array of programmable/configurable logic circuitry—and, as such, are not employed to connect to circuitry external to the programmable/configurable logic circuitry but may be employed to interface with I/O of logic tiles that are adjacent and physically opposing to the virtual array (e.g., adjacent and physically opposing logic tiles of different virtual arrays or an array and other logic tiles of the physical array of logic tiles)
Figure 7C:
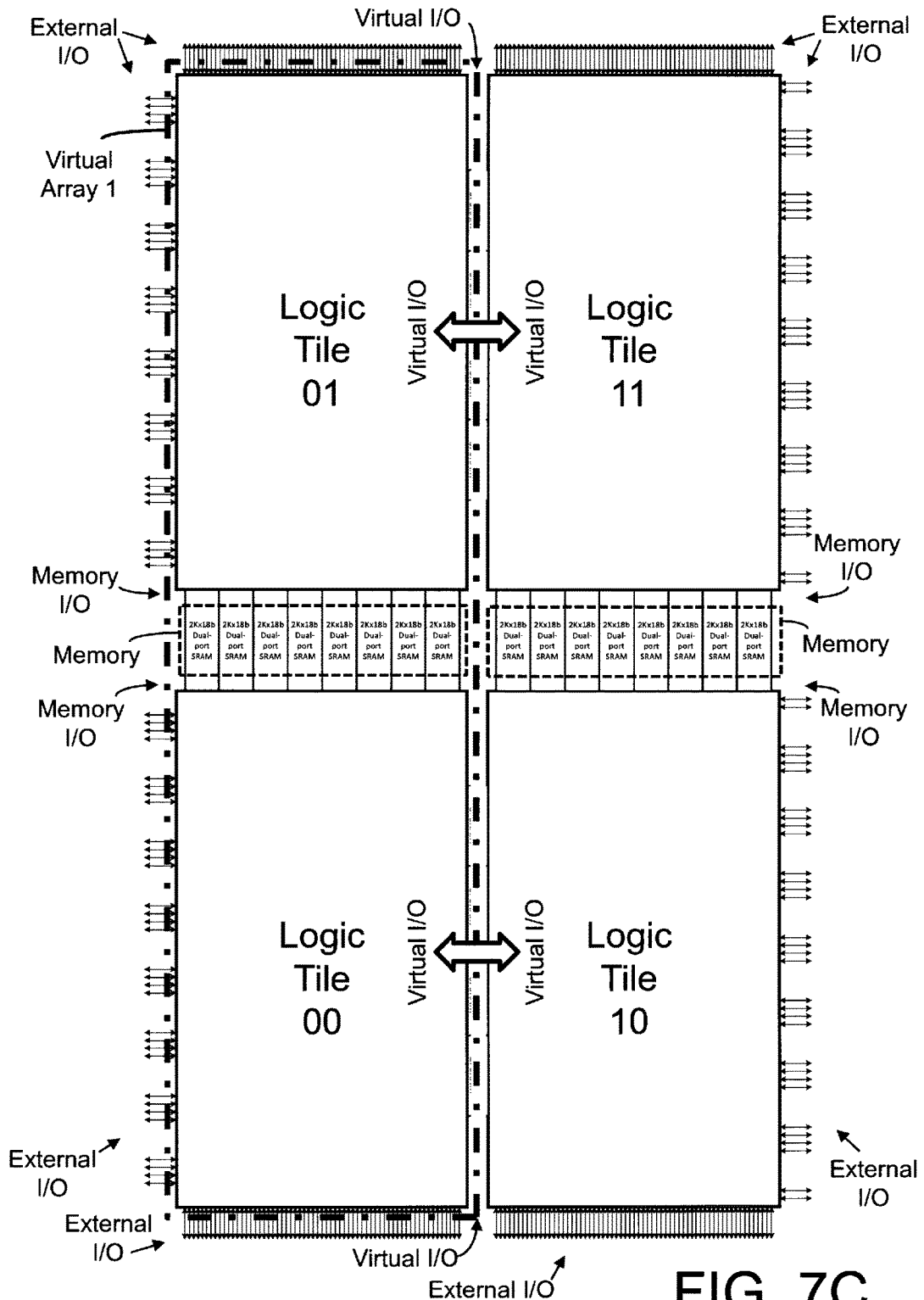
FIG. 7C illustrates, in block diagram form, an exemplary programmable/configurable logic circuitry according to certain aspects of the present inventions, wherein, in this exemplary embodiment, the programmable/configurable logic circuitry includes four logic tiles, wherein Logic Tiles 00 and 01 are configured or programmed as Virtual Array 1; Memory I/O of the logic tiles are disposed internal to the periphery of the logic tiles, Virtual I/O are disposed between the logic tiles of Virtual Array 1 and logic tiles that are not part of a virtual array, and external I/O, which are disposed on the periphery of the virtual array/physical array, are available for access by circuitry external to the programmable/configurable logic circuitry; notably, in this exemplary embodiment of a 2×2 physical array of logic tiles, memory is disposed between the logic tiles of the virtual array as well as Logic Tiles 10 and 11 of the remaining portion of this exemplary programmable/configurable logic circuitry embodiment and connect to the Memory I/O of the logic tiles to facilitate communication to the memory (i.e., read data from and/or write data to the memory from the adjacent logic tile and/or read data from and/or write data to the logic tile from the adjacent memory—as described and illustrated in U.S. patent application Ser. No. 15/239,958 (which is incorporated by reference herein in its entirety); such memory, in one embodiment, may be employed as a local or scratchpad memory for the virtual array to employ (e.g., storing intermediate calculations) wherein during performance of a function or operation, the logic tiles of virtual array may write data to and read data from the memory located outside of the array of logic tiles during operation of the logic tile; notably, in one embodiment, the memory is a dual-port memory disposed between (i) Logic Tile 00 and Logic Tile 01 and (ii) Logic Tile 10 and Logic Tile 11; again, Virtual I/O disposed between (i) Logic Tile 00 and Logic Tile 10 and (ii) Logic Tile 01 and Logic Tile 11 may be employed to transmit control signals and data between the logic tiles of the virtual array and the logic tiles of the other portions of the physical array (e.g., provide a communication bus between the virtual array that is configured as or to perform operations of a data processor, microcontroller, logic, an accelerator, a data encryption engine, a filter, a DSP, an encoder, and/or a state machine); such Virtual I/O are unused external I/O of adjacent logic tiles that are employed to provide direct communication between logic tiles.
Figure 8A:
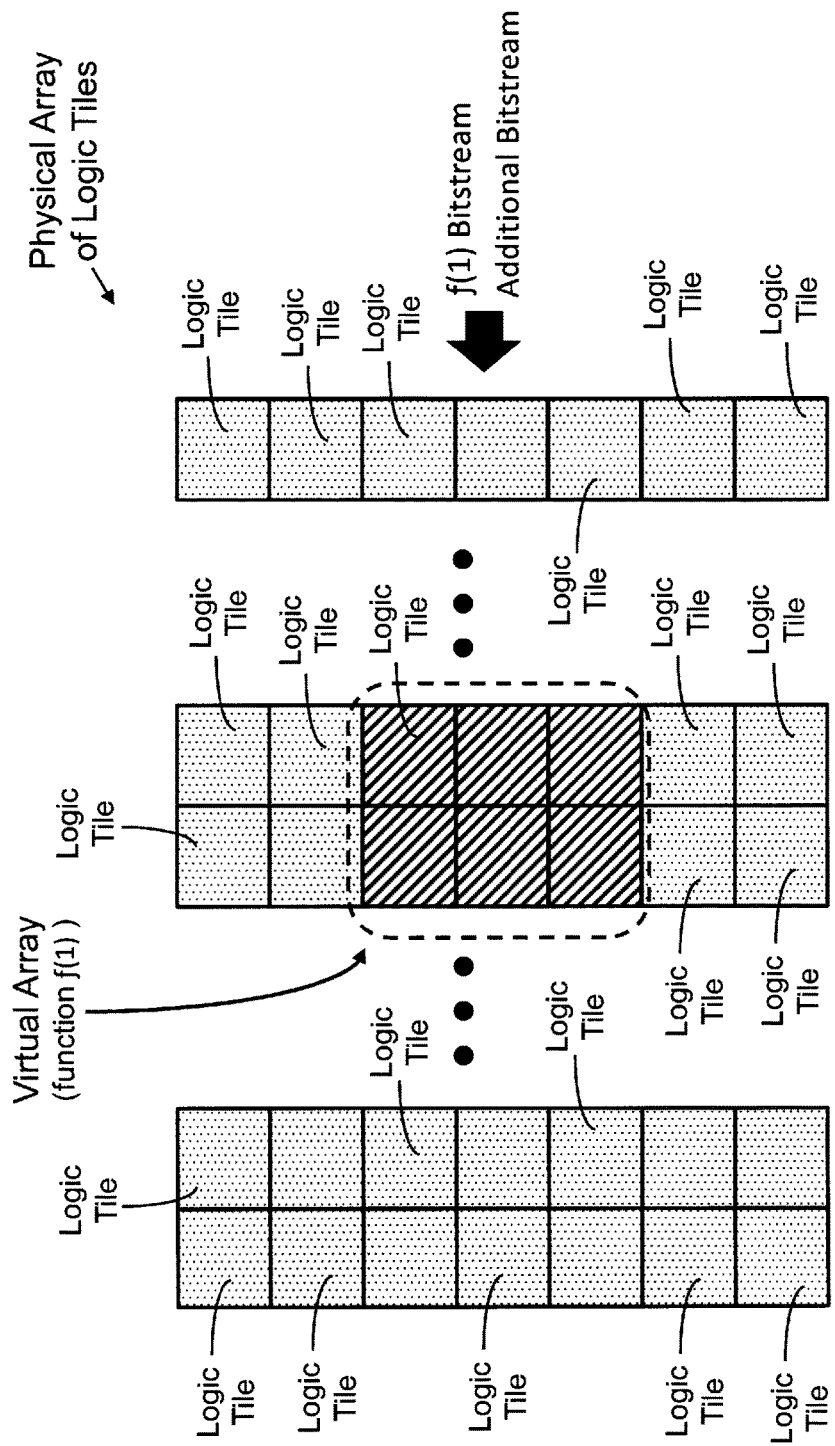
FIGS. 8A-8E illustrate, in block diagram form, exemplary embodiments of an FPGA including programmable/configurable logic circuitry having a physical array of a plurality of logic tiles functionally or operationally "partitioned" or arranged into one or more virtual arrays of physical logic tiles, in accordance with certain aspects of the present inventions; notably, one or more virtual arrays of logic tiles may be located fully or partially on a perimeter or periphery of the physical array of logic tiles or fully interior thereto; each virtual array may be comprised of the same or different number of physical logic tiles and may be organized, in relation to the physical array of logic tiles of the programmable/configurable logic circuitry, in any manner; moreover, although not illustrated, the Virtual Array(s) may (i) receive separate/distinct clock signals and/or common clock signals, (ii) include separate External I/Os (to communicate with circuitry external to the FPGA) and (iii) communicate with each other via Virtual I/Os and/or a switch matrix interconnect network (see, e.g., FIGS. 2B-2D and the description relating thereto).
Figure 8B:
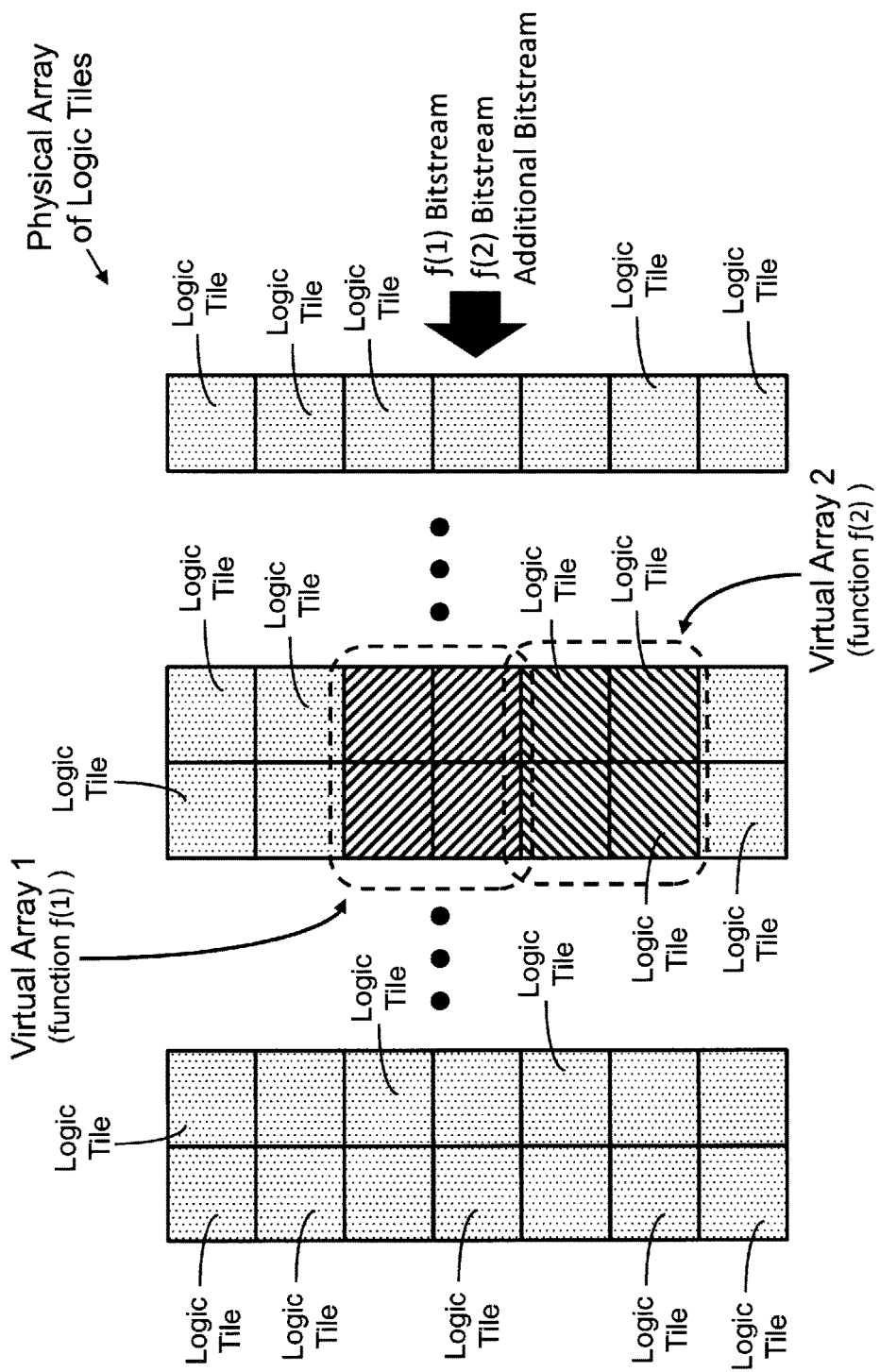
Figure 8C:
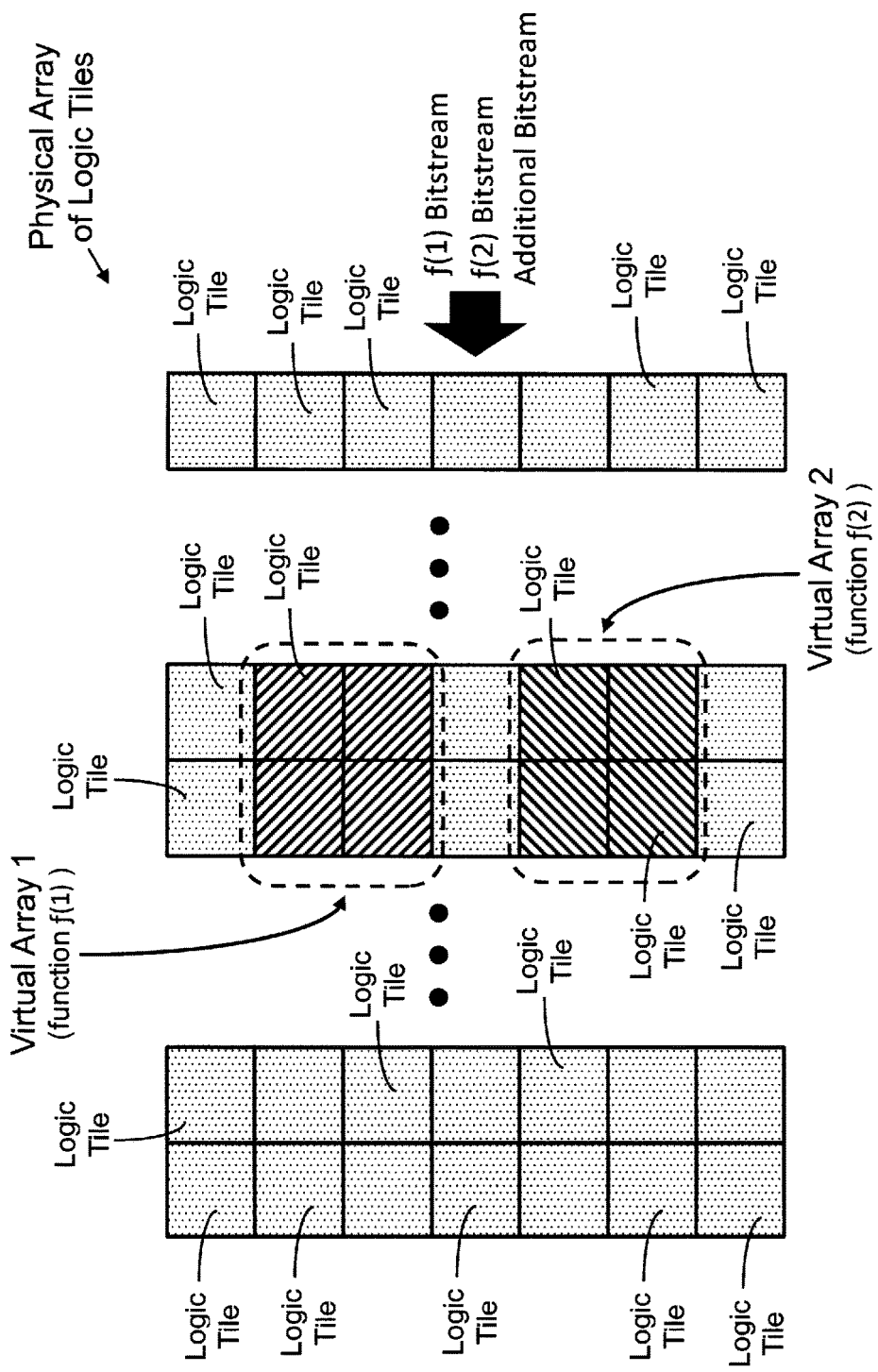
Figure 8D:
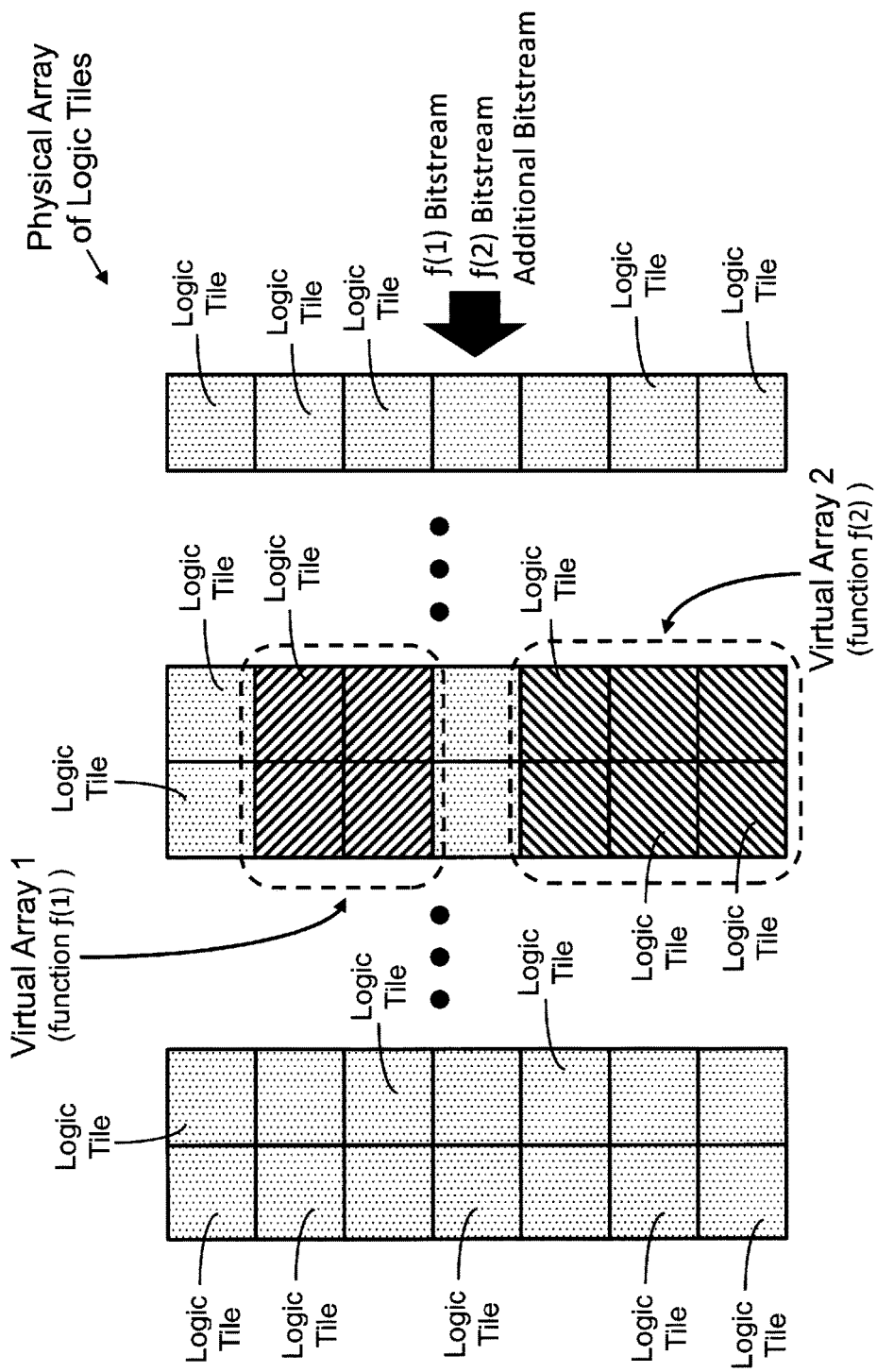
Figure 8E:
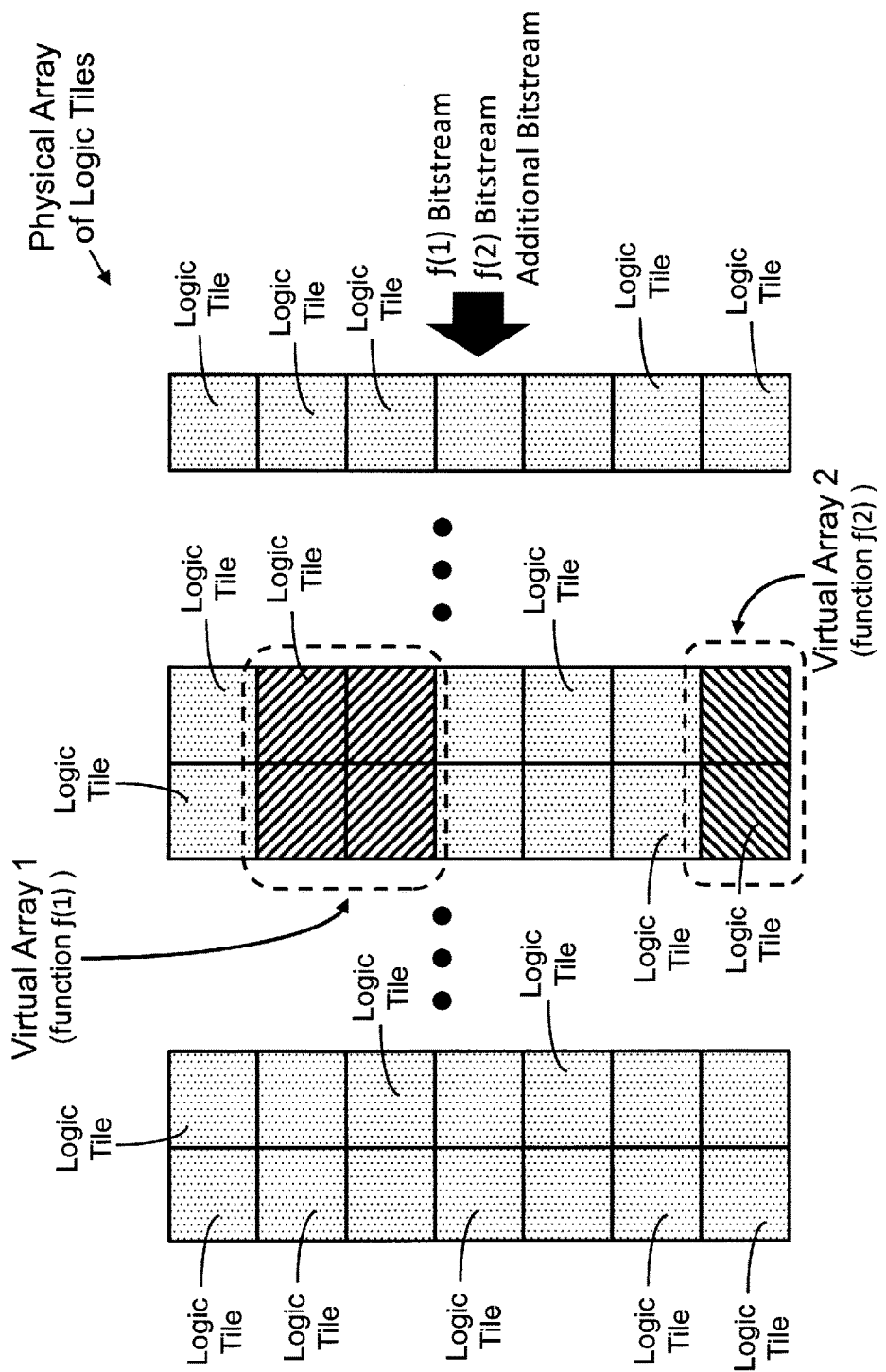

For example, logic tiles of two virtual arrays may communicate via a mixed-mode interconnect architecture or network wherein a hierarchical network is implemented within the logic tiles and a mesh network (e.g., a plurality of switches of a given state in a logic tile interconnect to a plurality of other switches of the same stage in another logic tile of a different virtual array) is implemented to connect logic tiles of the virtual arrays (e.g., in one embodiment, the mesh interconnects are the highest stage of the mixed-mode switch interconnect architecture—see, for example, FIG. 7A—wherein each switch matrix of the highest stage of the interconnect network in one or more (or all) logic tiles of Virtual Array 1 and Virtual Array 2 is/are connected to (i) a plurality of switch matrices of that stage in that logic tile and (ii) a plurality of switch matrices of the highest stage in at least one logic tile of virtual array 2). Notably, all combinations of communication between and among (and within) the logic tiles of the virtual arrays are intended to fall within the scope of the present invention. In addition, all combinations of communication (including forms and methods) between one or more virtual arrays and circuitry external to the physical array of logic tiles are intended to fall within the scope of the present invention.

With continued reference to FIGS. 2B-2D, in one embodiment, the virtual arrays of logic tiles may include and/or employ physically different or separate external I/Os. In addition thereto, or in lieu thereof, the virtual arrays of logic tiles include and/or employ physically common I/Os. Indeed, one or more (or all) of the virtual arrays of logic tiles may include and/or employ physically different or separate I/Os as well as physically common I/Os. All combinations and permutations of physically separate I/Os and as well as physically common I/Os, on a virtual array-by-virtual array basis, are intended to fall within the scope of the present inventions.

As noted above, one or more (or all) of the virtual arrays of logic tiles may "share" circuitry, memory (e.g., DRAM, SRAM etc.), clock generation or alignment circuitry (e.g., a PLL, DLL, oscillator) and/or other "resources" which are external to the entire physical array of physically contiguous logic tiles. For example, with reference to FIG. 2B, Virtual Array 1 and Virtual Array 2 couple to Clock Generation Circuitry (e.g., to receive one or more outputs of oscillator circuitry) and/or may access the same physical embedded or discrete memory. In one embodiment, the physical embedded or discrete memory associated with the FPGA may be segmented or partitioned such that certain subarrays, blocks or pages are associated with or allocated or dedicated to a particular virtual array or to two or more of the virtual arrays.

As stated above, in one embodiment, the FPGA of the invention employs the architectures described and/or illustrated in U.S. patent application Ser. No. 15/239,958 wherein memory is disposed between and adjacent to the logic tiles. (See, e.g., FIG. 7C). Briefly, discrete memory is disposed between the logic tiles of the Virtual Array as well as Logic Tiles 10 and 11 of other logic tiles (which may be another virtual array or a portion of the virtual array). The logic tiles, via memory I/O, connect to the memory to facilitate communication (read and/or write of data to/from the memory from/to the adjacent logic as described and illustrated in U.S. patent application Ser. No. 15/239,958. For example, in one embodiment, the memory is a dual-port memory disposed between (i) Logic Tile 00 and Logic Tile 01 and (ii) Logic Tile 10 and Logic Tile 11. Notably, the virtual I/O disposed between (i) Logic Tile 00 and Logic Tile 10 and (ii) Logic Tile 01 and Logic Tile 11 may be employed to transmit control signals, address and data between the logic tiles of the virtual array and logic tiles of other portions of the physical array (e.g., the virtual I/Os connect to a communication bus between the virtual array that is configured as or to perform operations of a data processor, microcontroller, logic, an accelerator, a data encryption engine, a filter, a DSP, an encoder, and/or a state machine and other logic tiles of the physical array (e.g., to interface with another virtual array (e.g., a processor or controller)).

Notably, the memory may be any kind, type, size and/or configuration.

The physical array of logic tiles may be programmed or configured using any technique now known or later developed—all of which is intended to fall within the scope of the present inventions. In one embodiment, the bitstreams which define, configure or program each of the virtual arrays of logic tiles are applied to the physical array separately (as separate or distinct bitstreams), thereby programming or configuring each virtual array separately. In another embodiment, bitstreams of configuration data which are representative of or correspond to configuration of an associated virtual array of logic tiles, are generated (e.g., separately) for each of the virtual arrays (e.g., by one or more compilers). The bitstreams associated with the virtual arrays of logic tiles are then provided to a compiler which uses the bitstreams to generate a combined, compiled or "merged" bitstream which is representative of or corresponds to the configuration data of the physical array of logic tiles—including each of the virtual arrays of logic tiles. Thereafter, the composite bitstream is broadcast or applied to the physical array of logic tiles which, in turn, programs or configures the physical array of logic tiles of the programmable/configurable logic circuitry of the FPGA to thereby allocate or partition the subsets of logic tiles into the virtual array(s) of logic tiles.

For example, with reference to FIGS. 4A-4D, one or more compilers separately generate the bit streams associated with or representative of the virtual arrays of logic tiles (which are designed or programmed to implement one or more functions/operations) and, using such bitstreams, generate or compile a composite bitstream. The composite bitstream is then employed to configure or program the physical array of logic tiles of the FPGA—including each of the virtual arrays of the physical logic tiles. Here, the composite bitstream is broadcast or applied to the physical array logic tiles to program or configure each of the virtual arrays to implement one or more predetermined functions/operations. That is, the composite bitstream is broadcast or applied to the entire physical array of logic tiles to program or configure the physical array of logic tiles of the programmable/configurable logic circuitry of the FPGA by partitioning the physical array into the subsets of logic tiles of the virtual array(s) of logic tiles—each of which designed or programmed to implement one or more functions/operations (e.g., processor, controller, an accelerator, a data encryption engine, a filter, an encoder, a DSP (implementing, for example, one or more multiplier-accumulator circuits and/or performing one or more multiplier-accumulator operations), a state machine). Thus, in this embodiment, the bitstream of a virtual array may be separately generated, thereafter combined, compiled or "merged" with the other bitstreams corresponding to the physical array of logic tiles (e.g., via one or more compilers) and then the composite bitstream is executed, broadcast or implemented to concurrently configure the virtual arrays of physical logic tiles of the FPGA, thereby rendering the FPGA operational.

Notably, in one embodiment, one or more virtual arrays of the logic tiles (implementing, for example, predefined functions/operations) may be locked, fixed and/or encrypted such that the configuration of that virtual array may not configured/re-configured, defined, modified and/or altered (e.g., before configuring the physical array of logic tiles). In addition thereof, or in lieu thereof, one or more other virtual arrays (implementing, for example, the same or different functions/operations) may be unlocked, definable or modifiable such that the configuration of the second virtual array may be configured/re-configured, determined and/or defined. For example, in one embodiment, the physical array of logic tiles includes one or more virtual arrays of the logic tiles that are "locked", fixed and/or encrypted such that a first user or designer is prohibited from accessing the configuration data of one or more of those virtual arrays (and thereby prohibited from programming, configuring, re-defining or modifying the functions/operations of the aforementioned virtual array(s)). In addition, one or more other virtual arrays may be "unlocked", programmable, definable or modifiable such that the first user or designer is not prohibited from accessing the configuration data of one or more of those virtual arrays (and thereby is not prohibited from programming, configuring, defining or modifying the functions/operations of such virtual array(s)). In this way, the first user may program or define certain virtual arrays and not program or define other virtual arrays (and/or even accessing the data that programs such other virtual arrays).

In this embodiment, the physical array of logic tiles may be programmed or configured by applying the bitstream(s) which define, configure or program each of the "locked" and "unlocked" virtual arrays of logic tiles separately, via separate or distinct bitstreams. In another embodiment, the physical array of logic tiles may be programmed or configured using a composite bitstream (as described above) by combining or compiling the bitstreams associated with the "locked" and "unlocked" virtual arrays of logic tiles (using a compiler) and thereafter the composite or combined configuration bitstream associated with the physical array (which includes the aforementioned virtual arrays) may be broadcast, executed, applied or implemented to program or configure the "locked" and "unlocked" virtual arrays of the FPGA in order to render the FPGA operational. For example, with reference to FIG. 4A, in one embodiment, Virtual Array 1 may be a "locked" virtual array and Virtual Array 2 may be an "unlocked" virtual array. Here, a compiler may generate a composite file or bitstream which includes the bitstream associated with Virtual Array 1 (which is designed to implement a first function/operation that is "locked", fixed and/or encrypted such that a first user or designer is prohibited from programming, configuring, defining or modifying) and the bitstream associated with the Virtual Array 2 (which may be "unlocked" and thereby user programmable, definable or configurable). Thereafter, the composite bitstream may be employed or broadcast to program or configure the entire physical array (which also programs or configures the locked and unlocked virtual arrays) of the FPGA.

Notably, such a process or technique may be employed in those embodiments having one or more "locked" virtual arrays and one or more "unlocked" virtual arrays. (See, e.g., FIGS. 4B-4D). For example, with reference to FIG. 4B, Virtual Array 1 and Virtual Array x may be "locked" virtual arrays and at least Virtual Array 2 may be an "unlocked" virtual array. The other virtual arrays (if any) may be "locked or "unlocked". Here, one or more compilers (i) generate bitstreams associated with or corresponding to $f(1), f(2) \ldots f(x)$, and thereafter (ii) generate a composite bitstream, using the individual bitstreams, by combining the individual bitstreams to generate a combined or composite bitstream associated with or corresponding to $f(1)+f(2)+\ldots+f(x)$. The composite bitstream may then be applied or broadcast to the programmable/configurable logic circuitry of the FPGA to program the physical array of logic tiles (which provides the functionally and/or operationally "partition" of the physical array into functionally and/or operationally associated subsets of physical logic tiles to "form" or provide the virtual arrays of the present inventions).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the one or more (or all) of the virtual arrays of logic tiles of the present inventions may be programmed/configured/defined to operate independently from one or more (or all) of the other virtual arrays. Such one or more (or all) of the virtual arrays of logic tiles may operate fully or partially independently during all or a portion of the operation of the FPGA. In one embodiment, one or more of the virtual arrays of logic tiles may be programmed/configured/defined to operate independently from one or more (or all) of the other virtual arrays and one or more of the same or different virtual arrays of logic tiles may be programmed/configured/defined to operate dependently on one or more (or all) of the other virtual arrays. Notably, all combinations and permutations of independent and dependent operation for each of the virtual arrays of logic tiles are intended to fall within the scope of the present inventions.

Moreover, as noted above, the virtual array(s) of the physical array of logic tiles may employ any clocking circuitry and technique now known or later developed. For example, in one embodiment, the virtual arrays employ mesh clocking circuitry and techniques. For example, with reference to FIGS. 5A and 5B, in one embodiment, the physical array of a plurality of logic tiles are arranged into two virtual arrays including a Virtual Array 1 (having M logic tiles where M is a positive integer) which is programmed/configured/defined to implement a first function/operation $f(1)$ and a Virtual Array 2 (having N logic tiles where N is a positive integer) which is programmed/configured/defined to implement a second function/operation $f(2)$. Each virtual array may receive one or more separate clock signal(s) as well as a mesh clock which may be distributed to each of the logic tiles and employed by the logic tiles to perform various functions/operations. Control circuitry of the FPGA may enable use of the mesh clock (in lieu of other clock signals) within one or more physical logic tiles of the virtual arrays and in connection with one or more functions/operations implemented by one or more virtual arrays of logic tiles. Notably, the mesh clocking circuitry (and mesh clock) may be implemented in any of the virtual array embodiments described and/or illustrated in FIGS. 2A-2D, 3A-3C and 4A-4D.

Figure 5A:
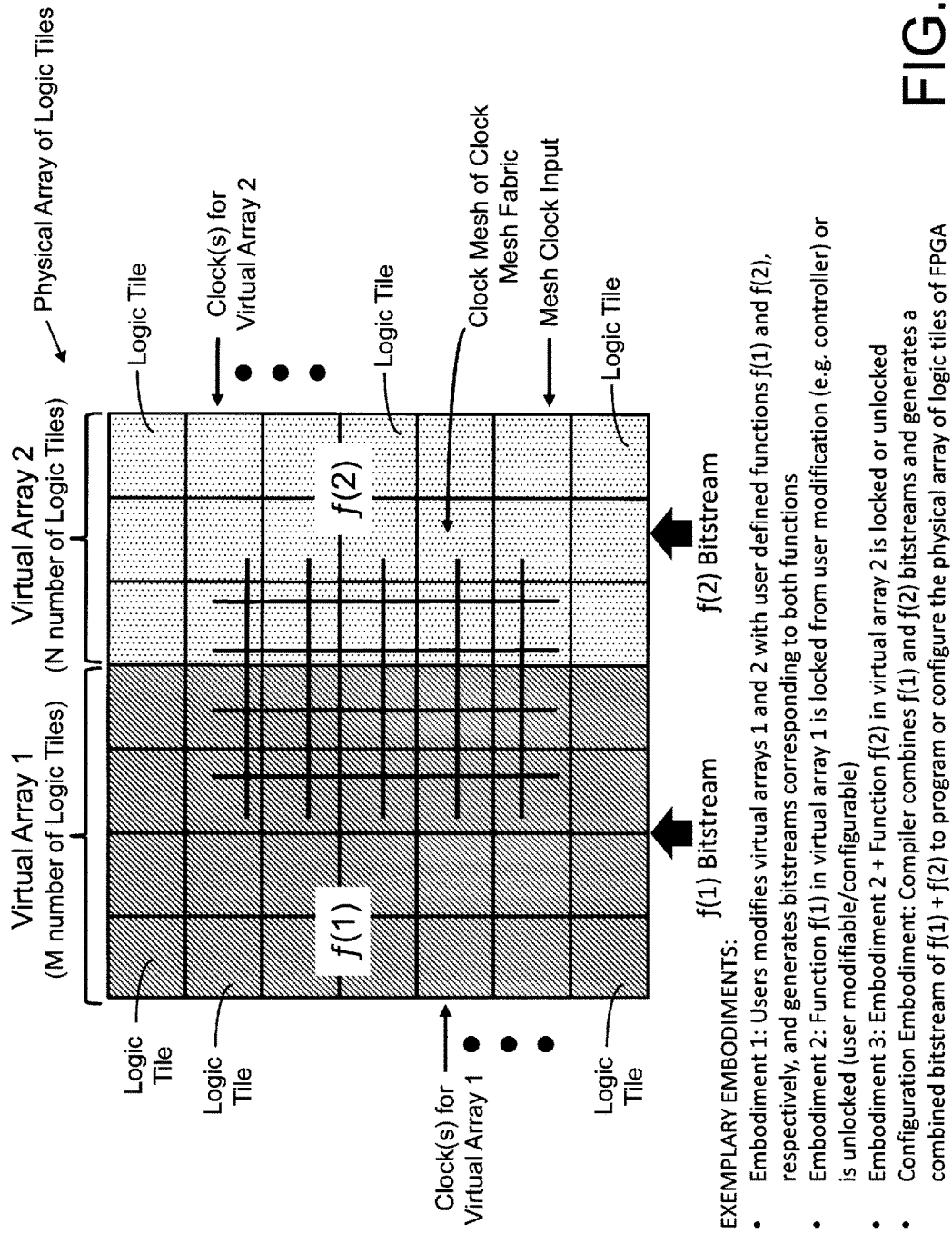
FIG. 5A illustrates, in block diagram form, exemplary embodiments of a physical array of a plurality of logic tiles functionally or operationally "partitioned" or arranged into two virtual arrays, in accordance with certain aspects of the present inventions, wherein in this illustrative exemplary embodiment, the physical array of a plurality of logic tiles is arranged into (i) a first virtual array of logic tiles (having M logic tiles where M is a positive integer) which is programmed/configured/defined to implement a first function/operation $f(1)$ and (ii) a second virtual array of the logic tiles (having N logic tiles where N is a positive integer) which is programmed/configured/defined to implement a second function/operation $f(2)$, and wherein each virtual array receives one or more clock signal(s) as well as a mesh clock which may be distributed to each of the logic tiles and employed by the logic tiles to perform various functions/operations; notably, control circuitry may enable use of the mesh clock (in lieu of other clock signals) within one or more physical logic tiles and/or within one or both of the virtual arrays, for example, in connection with one or more functions/operations implemented by such one or more virtual arrays of logic tiles; the control circuitry may control/establish the clock domain at start-up or initialization (e.g., via the data state of memory employed to set/control/establish the clock domain) and/or dynamically during normal operation of the FPGA or integrated circuit.
Figure 5B:
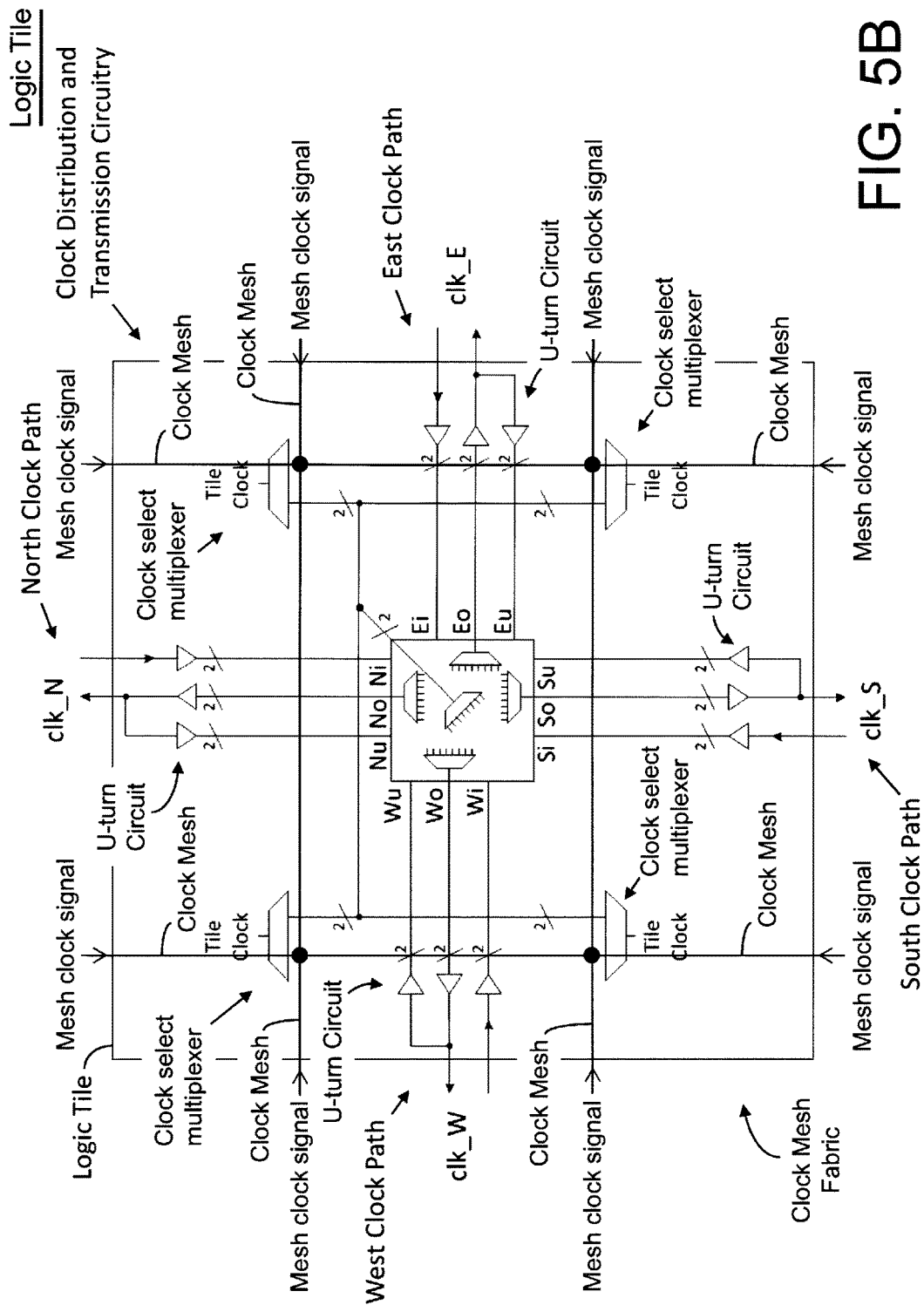
FIG. 5B illustrates, in a schematic block diagram form, an exemplary embodiment of clock distribution and transmission circuitry of a logic tile of the physical array of logic tiles wherein the clock distribution and transmission circuitry includes a plurality of input and output paths (four paths in this illustrated embodiment—labeled "north clock path", "east clock path", "south clock path" and "west clock path") to generate logic tile clock signals having a desired or programmable skew and, in addition receives a clock mesh (for transmitting a mesh clock signal to the logic tiles of, for example, the virtual arrays of logic tiles) which may be available to the circuitry of the logic tile via selectively enabling the output of the clock select multiplexer(s); such clock select multiplexers, in one embodiment, responsively output either the mesh clock signal or an internally generated/derived clock signal as a tile clock which is used by the circuitry of the logic tile to perform or execute, for example, functions and/or operations; control circuitry may enable use of the mesh clock (in lieu of other clock signals), via control of such multiplexer(s), within one or more physical logic tiles and in connection with one or more functions/operations implemented by one or more virtual arrays of logic tiles (see also, FIG. 5A); notably, certain aspects of the clock distribution and transmission circuitry is discussed in detail in U.S. Pat. No. 9,240,791 (which is hereby incorporated by reference for the purposes of illustration/explanation of such aspects of the clock distribution and transmission circuitry of FIG. 5B)

For example, with reference to FIG. 5B, in one embodiment the control circuitry selectively enables use of a clock mesh signal via control of a multiplexer which receives multiple clock signals (including the clock mesh clock). In this embodiment, clock distribution and transmission circuitry of a logic tile of the physical array of logic tiles includes a plurality of input and output paths (four paths in this illustrated embodiment—labeled "north clock path", "east clock path", "south clock path" and "west clock path") to generate logic tile clock signals having a desired or programmable skew and, in addition receives a clock mesh signal (via a mesh clock layout). By selectively controlling the clock select multiplexer(s), the logic tile employs a given clock signal (e.g., the mesh clock signal). That is, the clock select multiplexers, in one embodiment, responsively output either the mesh clock signal or an internally generated/derived clock signal as a tile clock which is used by the circuitry of the logic tile to perform or execute, for example, functions and/or operations. The control circuitry may enable use of the mesh clock (in lieu of other clock signals), via control of such clock select multiplexer(s), within one or more physical logic tiles and in connection with one or more functions/operations implemented by one or more virtual arrays of logic tiles.

Notably, the clock distribution and transmission circuitry of the U.S. Pat. No. 9,240,791, as modified in the manner set forth in relation to the clock mesh, may be employed herein. U.S. Pat. No. 9,240,791 is hereby incorporated by reference for the purpose of illustrating/explaining aspects of the clock distribution and transmission circuitry but is modified to include the multiplexers to responsively select a clock signal (e.g., the mesh clock signal) that is to be employed by the circuitry of the logic tile to perform or execute, for example, functions and/or operations.

Figure 6:
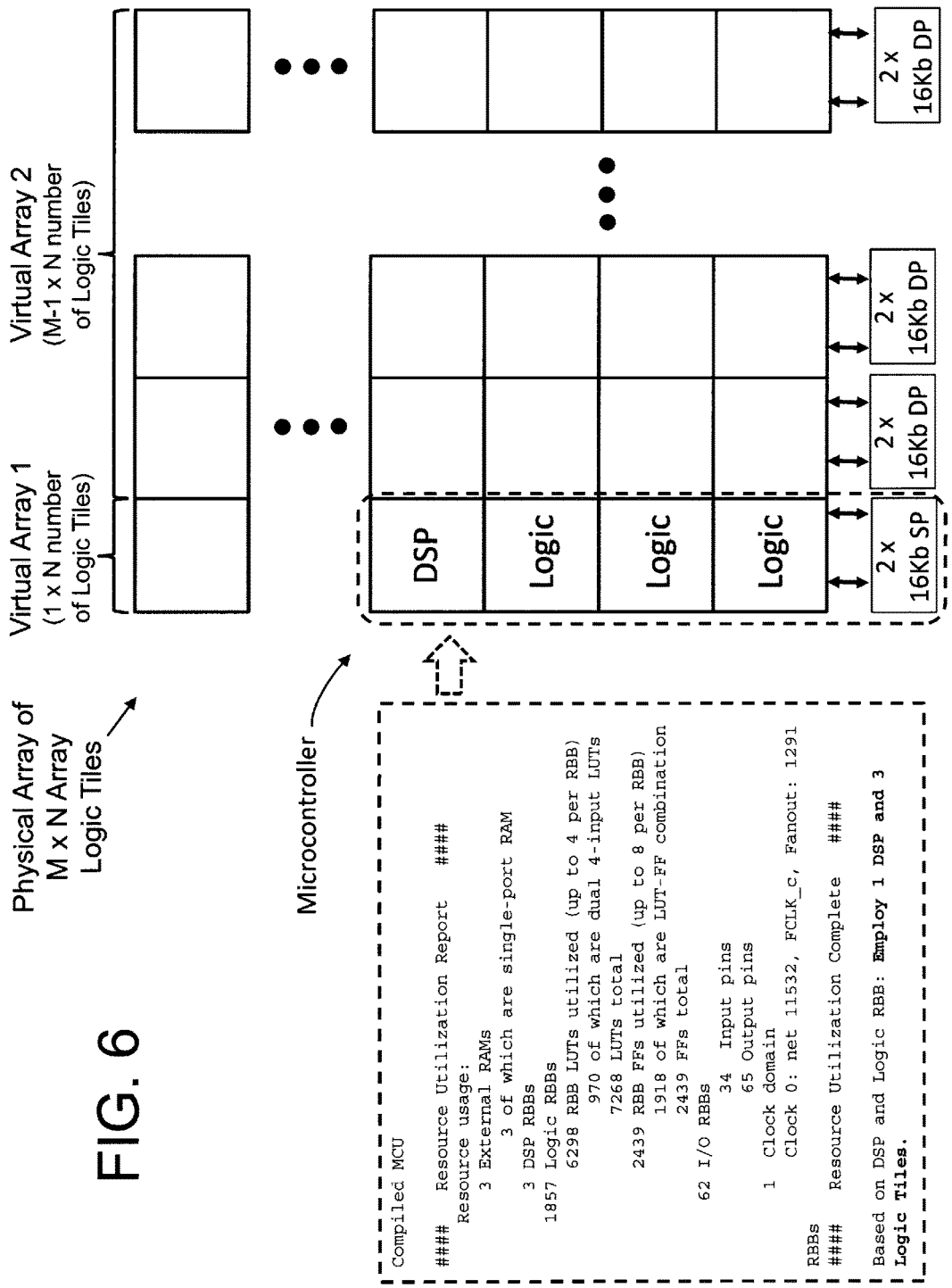
FIG. 6 illustrates, in block diagram form, exemplary embodiments of a physical array of a plurality of logic tiles functionally or operationally "partitioned" or arranged into two virtual arrays, in accordance with certain aspects of the present inventions, in conjunction with certain information regarding Virtual Array 1, including the internal resources of Virtual Array 1, in accordance with certain aspects of the present inventions; notably, Virtual Array 1 operation is configured as a data processor, a microcontroller and/or DSP with associated logic tiles including/providing logic circuitry supporting and/or complementing the DSP (i.e., the first function/operation) and the Virtual Array 2 may be configured by the user as, for example, logic, an accelerator, a data encryption engine, a filter, an encoder, a state machine and/or memory with an interconnect network (i.e., the second function/operation); moreover, certain logic tiles of the physical array of logic tiles are electrically connected to memory (e.g., SRAM, DRAM and MRAM) on a "bottom" edge/perimeter of the physical array to read data therefrom and write data thereto.

Further, the one or more virtual arrays of logic tiles may be programmed, configured or defined to implement any function/operation now known or later developed. For example, in one embodiment, one or more virtual arrays are programmed or configured as a data processor, a microcontroller, an accelerator, a data encryption engine, a filter and/or an encoder. (See also, an exemplary embodiment of Virtual Array 1 configured or programmed as a microcontroller unit (having a DSP configured, for example, via one or more multiplier-accumulator circuits and/or configured to perform one or more multiplier-accumulator operations) in FIG. 6).

In addition, one or more virtual arrays of logic tiles may be located fully or partially on a perimeter or periphery of the physical array of logic tiles or fully interior thereto. (See, e.g., FIGS. 8A-8E). As noted above, where the physical array of logic tiles includes a plurality of virtual arrays, the virtual arrays may be comprised of the same or different number of physical logic tiles and may be organized, in relation to the physical array of logic tiles of the programmable/configurable logic circuitry, in any manner. All combinations and permutations are intended to fall within the scope of the present inventions. With reference to FIGS. 8A-8E, although not illustrated, the Virtual Array(s) may (i) receive separate/distinct clock signals and/or common clock signals, (ii) include separate External I/Os (to communicate with circuitry external to the FPGA) and (iii) communicate with each other via Virtual I/Os and/or a switch matrix interconnect network (see, e.g., FIGS. 2B-2D and the description relating thereto).

Moreover, for the purposes of clarity, I/O (e.g., external I/O and virtual I/O), clocking features, and/or memory are not illustrated in all of the exemplary embodiments of the Figures. For the avoidance, however, the exemplary embodiments described and illustrated herein (e.g., FIGS. 3A-3C, 4A-4D and 8A-8E) may employ any I/O architectures/embodiments (see, e.g., FIGS. 1C, 1D, 2B-2D and 7B), switch interconnect network architectures/embodiments (see, e.g., FIG. 7A), clocking architectures/embodiments (see, e.g., FIGS. 2B-2D, 5A and 5B) and/or memory architectures/embodiments (see, e.g., FIGS. 2B-2D and 7C) described and illustrated herein.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

Further, the term "logic tile" means a design unit or block of a plurality of transistors (typically more than thousands) that are connected or configured, for example, into programmable components (e.g., programmable logic components), which, in this application, is capable of connecting to one or more neighboring "logic tiles". The term (i) "integrated circuit" means, among other things, a processor, controller, state machine, gate array, SOC, PGA and/or FPGA.

In addition, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like). Further, the term "initialization operation" means the power-up, start-up, initialization, re-initialization, configuration, and/or re-configuration operation of the robust type memory cells (or the storage elements thereof) and/or the integrated circuit. The term data processing operations means operations including digital signal processing, encoding, decoding, encrypting, decrypting and/or other forms of data manipulation.

What is claimed is:

1. An integrated circuit comprising:
   programmable/configurable logic circuitry having a periphery, the programmable/configurable logic circuitry includes:
      a physical array of logic tiles, wherein each logic tile of the physical array of logic tiles includes a plurality of I/Os arranged in a common layout on the perimeter of the logic tile, wherein the physical array of logic tiles includes:
         a first virtual array of logic tiles having a periphery and including a first plurality of logic tiles of the physical array of logic tiles, wherein, in operation, the first virtual array of logic tiles is programmed to perform data processing operations, wherein the first plurality of logic tiles of the first virtual array of logic tiles includes:
            a first logic tile having a perimeter including:
               a first portion of the perimeter which forms at least a portion of the periphery of the programmable/configurable logic circuitry, wherein the I/Os located on the first portion of the perimeter of the first logic tile are (a) I/Os of the first virtual array of logic tiles and (b) configured to directly connect to circuitry external to the physical array of logic tiles, and
               a second portion of the perimeter which is interior to the periphery of the first virtual array of logic tiles, wherein the I/Os located on the second portion of the perimeter of the first logic tile are virtual I/Os of the first virtual array; and
         a second virtual array of logic tiles having a periphery including a second plurality of logic tiles of the physical array of logic tiles wherein each logic tile of the second plurality of logic tiles is a different logic tile from the logic tiles of the first plurality of logic tiles, and wherein, in operation, the second virtual array of logic tiles is programmed to perform second operations, and wherein the second plurality of logic tiles of the second virtual array of logic tiles includes:
            one or more logic tiles having a perimeter including:
               a first portion of the perimeter which forms at least a portion of the periphery of the programmable/configurable logic circuitry, wherein the I/Os located on the first portion of the perimeter of the one or more logic tiles are (a) I/Os of the second virtual array and (b) configured to directly connect to circuitry external to the physical array of logic tiles, and
               a second portion of the perimeter which is interior to the periphery of the second virtual array of logic tiles and adjacent to the second portion of the perimeter of the first logic tile, wherein I/Os located on the second portion of the perimeter of the one or more logic are (a) virtual I/Os of the second virtual array and (b) configured to directly connect to the virtual I/Os of the first virtual array to enable communication therebetween.

2. The integrated circuit of claim 1 wherein:
   the first virtual array of logic tiles receives a first clock signal and uses the first clock signal to perform the data processing operations, and
   the second virtual array of logic tiles receives a second clock signal and uses the second clock signal to perform the second operations, and wherein the first clock signal is different from the second clock signal.

3. The integrated circuit of claim 1 wherein:
   the first plurality of logic tiles of the first virtual array of logic tiles are contiguous logic tiles of the physical array of logic tiles.

4. The integrated circuit of claim 1 wherein:
   the first plurality of logic tiles of the first virtual array are contiguous and form a column or row logic tiles of the physical array of logic tiles.

5. The integrated circuit of claim 1 wherein:
   the first virtual array of logic tiles consist substantially of a microcontroller.

6. The integrated circuit of claim 1 wherein:
   at least one logic tile of the first virtual array of logic tiles includes:
      a perimeter which forms at least a portion of the periphery of the programmable/configurable logic circuitry, wherein a plurality of the I/Os located on the perimeter of the at least one logic tile are external I/Os of the first virtual array of logic tiles that directly connect to memory, and
      circuitry configurable to read data from and write data to the memory via the first portion of the external I/Os located on the perimeter of the at least one logic tile.

7. The integrated circuit of claim 1 wherein:
   in operation, performance of the data processing operations of the first virtual array of logic tiles is independent from performance of the second operations of the second virtual array of logic tiles.

8. The integrated circuit of claim 1 wherein:
   each logic tile of the physical array of logic tiles includes an interconnect network including a plurality of multiplexers in the logic tile.

9. The integrated circuit of claim 8 wherein:
   the interconnect network in each logic tile in the second virtual array of logic tiles is interconnected to another logic tile in the second virtual array of logic tile via a mesh interconnect network.

10. A method of configuring a field programmable gate array of an integrated circuit, the field programmable gate array including (i) memory to store data and (ii) programmable/configurable logic circuitry having a periphery, the programmable/configurable logic circuitry includes a physical array of logic tiles, wherein each logic tile of the physical array of logic tiles includes a perimeter and a plurality of I/Os disposed in an I/O layout on the perimeter of the logic tile wherein the I/O layout of each logic tile is the same, the method comprising:
reading configuration data stored in the memory, wherein the configuration data includes first configuration data and second configuration data;
applying the configuration data to the physical array of logic tiles to configure the logic tiles of the physical array of logic tiles into one or more predetermined configurations, including:
applying first configuration data to a first plurality of logic tiles of the physical array of logic tiles to configure a first virtual array of logic tiles including configuring I/Os located on a portion of the perimeter of at least one logic tile of the first plurality of logic tiles, which is interior to the periphery of the programmable/configurable logic circuitry, as virtual I/Os of the first virtual array, wherein the first virtual array of logic tiles includes the first plurality of logic tiles, to perform a first data processing operation, and
applying second configuration data to a second plurality of logic tiles of the physical array of logic tiles to configure a second virtual array of logic tiles including configuring I/Os located on a portion of the perimeter of at least one logic tile of the second plurality of logic tiles, which is interior to the periphery of the programmable/configurable logic circuitry, as virtual I/Os of the second virtual array which directly connect to virtual I/Os of the first virtual array, wherein the second virtual array of logic tiles includes the second plurality of logic tiles; to perform a second data processing operation; and
wherein, in operation, the first virtual array of logic tiles performs the first data processing operation independently of the second virtual array of logic tiles performance of the second data processing operation and the first virtual array of logic tiles communicates directly with the second virtual array of logic tiles via virtual I/Os of each of the first and second virtual arrays.

11. The method of claim 10 wherein:
applying the configuration data to the physical array of logic tiles to configure the logic tiles of the physical array of logic tiles further includes applying a composite bitstream to the first plurality of logic tiles and the second plurality of logic tiles, wherein the composite bitstream includes the first configuration data and the second configuration data.

12. The method of claim 11 wherein:
the first configuration data is encrypted data.

13. The method of claim 10 wherein:
applying the configuration data to the physical array of logic tiles to configure the logic tiles of the physical array of logic tiles further includes separately:
applying a first bitstream to the first plurality of logic tiles wherein the first bitstream includes the first configuration data, and
applying a second bitstream to the second plurality of logic tiles, wherein the second bitstream includes the second configuration data.

14. The method of claim 13 wherein:
the first configuration data is encrypted data.

15. The method of claim 10 further including:
storing the configuration data in the memory.

16. The method of claim 10 wherein:
applying the configuration data to the physical array of logic tiles to configure the logic tiles of the physical array of logic tiles further includes reading the configuration data from the memory.

17. An integrated circuit comprising:
programmable/configurable logic circuitry having a periphery, the programmable/configurable logic circuitry includes a physical array of logic tiles, wherein each logic tile of the physical array of logic tiles includes a perimeter and a plurality of I/O disposed in an I/O layout on the perimeter of the logic tile wherein the I/O layout of each logic tile is identical, wherein the physical array of logic tiles includes:
a first virtual array of logic tiles having a periphery and including a first plurality of logic tiles of the physical array of logic tiles, wherein the first plurality of logic tiles includes at least one logic tile having virtual I/Os located on a portion of the perimeter thereof which is interior to the periphery of the programmable/configurable logic circuitry, and wherein, in operation, the first virtual array of logic tiles is programmed to perform data processing operations; and
a second virtual array of logic tiles having a periphery including a second plurality of logic tiles of the physical array of logic tiles wherein the second plurality of logic tiles includes at least one logic tile having virtual I/Os located on a portion of the perimeter thereof which (i) is interior to the periphery of the programmable/configurable logic circuitry and (ii) directly connected to the virtual I/Os of the at least one logic tile of the first plurality of logic tiles to enable communication therebetween, and each logic tile of the second plurality of logic tiles is a different logic tile from the logic tiles of the first plurality of logic tiles, and wherein, in operation, the second virtual array of logic tiles is programmed to perform second operations; and
wherein, in operation, performance of the data processing operations of the first virtual array of logic tiles is independent from performance of the second operations of the second virtual array of logic tiles.

18. The integrated circuit of claim 17 wherein:
the first plurality of logic tiles of the first virtual array of logic tiles are contiguous logic tiles of the physical array of logic tiles.

19. The integrated circuit of claim 17 wherein:
the first plurality of logic tiles of the first virtual array are contiguous and form a column or row logic tiles of the physical array of logic tiles.

20. The integrated circuit of claim 17 wherein:
the first virtual array of logic tiles consist substantially of a microcontroller.

* * * * *